(12) United States Patent
Park et al.

(10) Patent No.: US 12,366,772 B2
(45) Date of Patent: Jul. 22, 2025

(54) OPTICAL PATH CONTROL MEMBER AND DISPLAY DEVICE COMPRISING THE SAME

(71) Applicant: LG INNOTEK CO., LTD., Seoul (KR)

(72) Inventors: Jin Gyeong Park, Seoul (KR); Byung Sook Kim, Seoul (KR); Jong Sik Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 251 days.

(21) Appl. No.: 18/052,443

(22) Filed: Nov. 3, 2022

(65) Prior Publication Data

US 2023/0132725 A1    May 4, 2023

(30) Foreign Application Priority Data

Nov. 3, 2021  (KR) .................. 10-2021-0149836

(51) Int. Cl.
*G02F 1/1335* (2006.01)
*H10K 59/126* (2023.01)

(52) U.S. Cl.
CPC ..... *G02F 1/133512* (2013.01); *H10K 59/126* (2023.02)

(58) Field of Classification Search
CPC ...... G02F 1/167; G02F 1/1335; G02F 1/1323; G02F 1/1675; G02F 1/1679;
(Continued)

(56) References Cited

U.S. PATENT DOCUMENTS

2016/0291441 A1* 10/2016 Yamazaki ............... G02F 1/167
2020/0033689 A1*  1/2020 Lee ......................... H10K 59/50

FOREIGN PATENT DOCUMENTS

JP     2010-85566 A      4/2010
JP     2010186025 A  *  8/2010
(Continued)

OTHER PUBLICATIONS

Office Action dated Feb. 2, 2025 in Korean Application No. 10-2021-014836.

*Primary Examiner* — Shan Liu
(74) *Attorney, Agent, or Firm* — Saliwanchik, Lloyd & Eisenschenk

(57) ABSTRACT

An optical path control member according to an embodiment includes: a first substrate on which a first direction and a second direction are defined; a first electrode disposed on the first substrate; a second substrate disposed on the first substrate and defining the first direction and the second direction; a second electrode disposed under the second substrate; a light conversion part disposed between the first electrode and the second electrode; an adhesive layer disposed between the first electrode and the light conversion part, and a cutting region formed by removing the second substrate, the second electrode, and the light conversion part, wherein the cutting region includes a first cutting region and a second cutting region that extend in a length direction of the first direction and are disposed to face each other in the second direction, the first cutting region and the second cutting region include a first region in which the adhesive layer is formed and a second region formed by partially or entirely removing the adhesive layer, and a first sealing part is disposed in the cutting region.

15 Claims, 23 Drawing Sheets

(58) Field of Classification Search
CPC .......... G02F 2001/1678; G02F 1/1676; G02F 1/133524; G02F 1/1681; G02F 1/1337; G02F 1/1677; G02F 1/133512; G02F 2202/28; G02F 1/1339; G02F 2201/50; G02F 1/0102; G02F 1/0107; G02F 1/1347; G02F 1/035; G02F 1/13338; G02F 1/133602; H10K 59/126; H10K 59/50; H10K 59/40; G09F 9/335

See application file for complete search history.

(56) References Cited

FOREIGN PATENT DOCUMENTS

| | | |
|---|---|---|
| KR | 10-2016-0018131 A | 2/2016 |
| KR | 10-2017-0031488 A | 3/2017 |
| KR | 10-2020-0012683 A | 2/2020 |
| KR | 10-2021-0041847 A | 4/2021 |

* cited by examiner (a)

(b)

OPTICAL PATH CONTROL MEMBER AND DISPLAY DEVICE COMPRISING THE SAME

CROSS-REFERENCE TO RELATED APPLICATION

This application claims priority to and the benefit of Korean Patent Application No. 10-2021-0149836, filed on Nov. 3, 2021, the disclosure of which is incorporated herein by reference in its entirety.

TECHNICAL FIELD

Embodiments relate to an optical path control member, and to a display device including the same.

BACKGROUND

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by switching a pattern part to a light transmitting part and a light blocking part by filling the inside of the pattern part with particles that may move when a voltage is applied and a dispersion liquid for dispersing the particles and by dispersing and aggregating the particles.

In this case, in order to apply a voltage to the light blocking film, an electrode of the switchable light blocking film and an external power source should be connected. Such a connection portion is an electrode connection portion that is not a region for controlling a viewing angle and may be defined as a bezel region in a display device.

Meanwhile, the light blocking film may have an adhesive layer disposed in some regions in order to bond a layer structure of the light blocking film. However, since the adhesive layer has a very low moisture permeability, moisture may permeate into the light blocking film through the adhesive layer, thereby deteriorating reliability of the light blocking film. For example, when moisture permeates into the light blocking film, an appearance defect may occur, and a dielectric constant of a region where moisture permeates and a region where moisture does not permeate among regions where a light conversion material is disposed is changed, so that a difference in driving speed in each region may occur.

Therefore, there is a need for an optical path control member having a new structure capable of solving the above problems.

SUMMARY

Technical Problem

An embodiment is directed to providing an optical path control member having improved reliability and driving characteristics by effectively blocking moisture that may be introduced thereinto through an adhesive layer.

Technical Solution

An optical path control member according to an embodiment includes: a first substrate on which a first direction and a second direction are defined; a first electrode disposed on the first substrate; a second substrate disposed on the first substrate and defining the first direction and the second direction; a second electrode disposed under the second substrate; a light conversion part disposed between the first electrode and the second electrode; an adhesive layer disposed between the first electrode and the light conversion part, and a cutting region formed by removing the second substrate, the second electrode, and the light conversion part, wherein the cutting region includes a first cutting region and a second cutting region that extend in a length direction of the first direction and are disposed to face each other in the second direction, the first cutting region and the second cutting region include a first region in which the adhesive layer is formed and a second region formed by partially or entirely removing the adhesive layer, and a first sealing part is disposed in the cutting region.

Advantageous Effects

An optical path control member according to an embodiment may be formed into two regions according to a degree to which a cutting region in which a sealing part is disposed is cut.

In detail, the cutting region may be formed with a first region where an adhesive layer is exposed and a second region including a stepped portion having a step difference from the first region.

The second region may be defined as a region in which the adhesive layer is partially or entirely removed.

Accordingly, when disposing the sealing part in the cutting region, the sealing part may also be disposed in the region from which the adhesive layer is removed.

Therefore, by reinforcing the adhesive layer vulnerable to moisture with the sealing part, it is possible to inhibit moisture from penetrating into the optical path control member through the adhesive layer from the outside.

Accordingly, it is possible to inhibit an appearance defect of the optical path control member and to inhibit a decrease in driving characteristics due to moisture penetration, so that the optical path control member according to the embodiment may have improved reliability and driving characteristics.

DETAILED DESCRIPTION OF THE EMBODIMENTS

Figure 1:
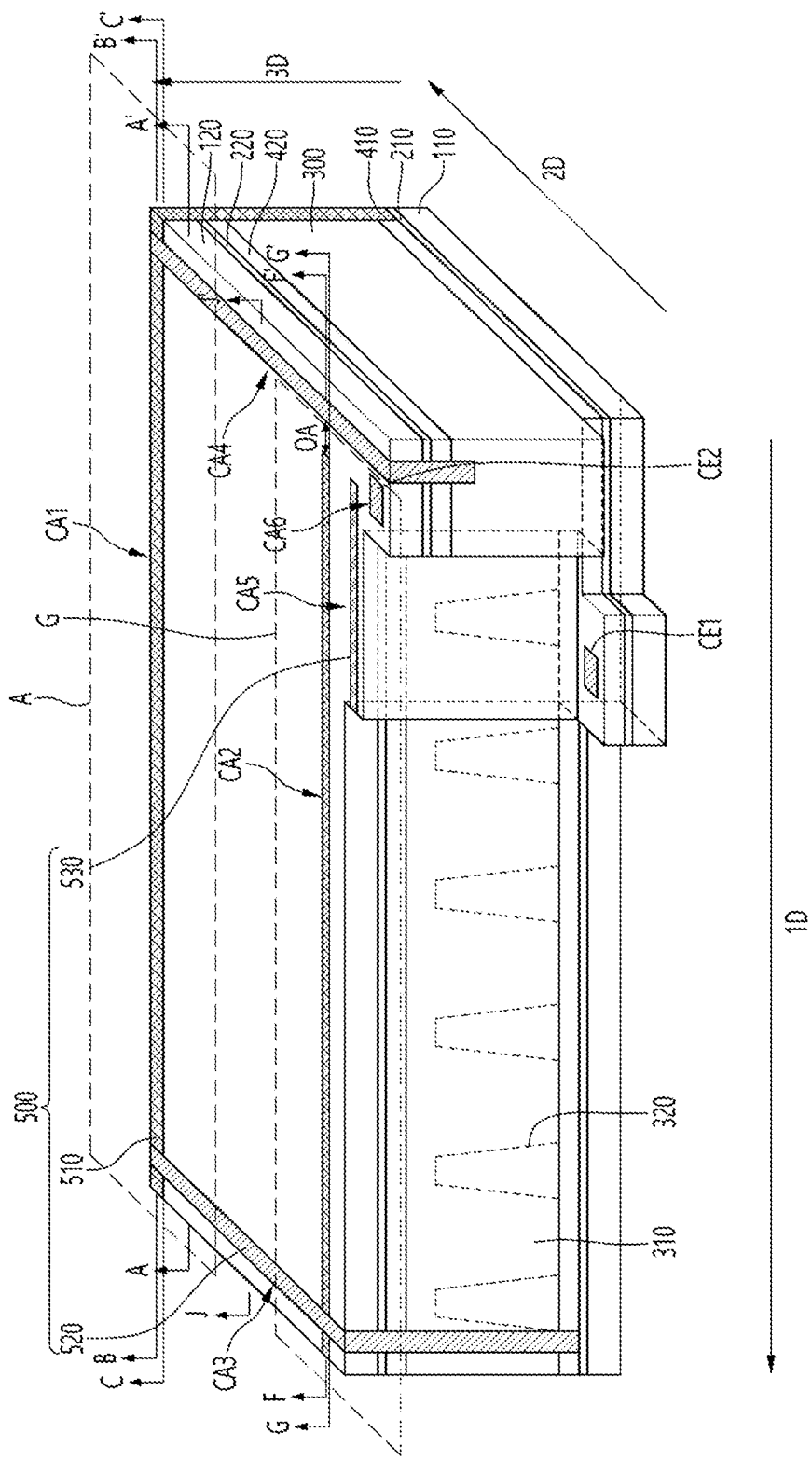
FIG. 1 is a perspective view of an optical path control member according to an embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below may be a switchable light blocking film driven in a share mode and a privacy mode according to application of power.

Meanwhile, for convenience of description, in the following drawings, it is illustrated that an inner surface of a cutting region is perpendicular to a bottom surface, but the embodiment is not limited thereto. That is, the inner surface of the cutting region may be formed to be inclined at an acute angle or an obtuse angle with respect to the bottom surface.

Referring to FIGS. 1 to 7, an optical path control member according to an embodiment may include a first substrate 110, a second substrate 120, a first electrode 210, a second electrode 220, and a light conversion part 300.

Referring to FIG. 1, an optical path control member 1000 according to an embodiment may include a first substrate 110, a second substrate 120, a first electrode 210, a second electrode 220, and a light conversion part 300.

The first substrate 110 and the second substrate 120 may be rigid or flexible.

In addition, the first substrate 110 and the second substrate 120 may be transparent. For example, the first substrate 110 and the second substrate 120 may include a transparent substrate capable of transmitting light.

The first substrate 110 and the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 and the second substrate 120 may be a flexible substrate having flexible characteristics.

Further, the first substrate 110 and the second substrate 120 may be a curved or bended substrate. That is, the optical path control member including the first substrate 110 and the second substrate 120 may also be formed to have flexible, curved, or bent characteristics. Accordingly, the optical path control member according to the embodiment may be changed to various designs.

The first electrode 210 may be disposed on one surface of the first substrate 110. In addition, the second electrode 220 may be disposed on one surface of the second substrate 120.

The first electrode 210 and the second electrode 220 may include a transparent conductive material. For example, the first electrode 210 and the second electrode 220 may include a conductive material having a light transmittance of about 80% or more. As an example, the first electrode 210 and the second electrode 220 may include a metal oxide such as indium tin oxide, indium zinc oxide, copper oxide, tin oxide, zinc oxide, titanium oxide, etc.

The first electrode 210 and the second electrode 220 may have a thickness of about 10 nm to about 300 nm.

Alternatively, the first electrode 210 and the second electrode 220 may include various metals to realize low resistance. For example, the first electrode 210 and the second electrode 220 may include at least one metal of chromium (Cr), nickel (Ni), copper (Cu), aluminum (Al), silver (Ag), molybdenum (Mo). Gold (Au), titanium (Ti), and alloys thereof.

The first electrode 210 and the second electrode 220 may be disposed on an entire surface of one surface of the first substrate 110 and the second electrode 220, respectively. In detail, the first electrode 210 may be disposed as a surface electrode on one surface of the first substrate 110, and the second electrode 220 may be disposed as a surface electrode on one surface of the second substrate 120. However, the embodiment is not limited thereto, and at least one of the first electrode 210 and the second electrode 220 may be formed of a plurality of pattern electrodes having a uniform pattern such as a mesh or stripe shape.

For example, at least one of the first electrode 210 and the second electrode 220 may include a plurality of conductive patterns. In detail, at least one of the first electrode 210 and the second electrode 220 may include a plurality of mesh lines crossing each other and a plurality of mesh openings formed by the mesh lines.

Accordingly, even though the first electrode 210 and the second electrode 220 include a metal, the first electrode 210 and the second electrode 220 are not visually recognized from the outside, so that visibility may be improved. In addition, the light transmittance is increased by the openings, so that the brightness of the optical path control member according to the embodiment may be improved.

The light conversion part 300 may be disposed between the first substrate 110 and the second substrate 120. In detail, the light conversion part 300 may be disposed between the first electrode 210 and the second electrode 220.

An adhesive layer 410 may be disposed between the light conversion part 300 and the first electrode 210. The light conversion part and the first electrode 210 may be adhered through the adhesive layer 410.

A buffer layer 420 may be disposed between the light conversion part 300 and the second electrode 220. The buffer layer 420 may improve adhesion between the second electrode 220 and the light conversion part 300 which are a heterogeneous material. That is, the buffer layer 420 may be a primer layer disposed between the light conversion part 300 and the second electrode 220.

The adhesive layer 410 and the buffer layer 420 may include a transparent material capable of transmitting light. As an example, the adhesive layer 420 may include an optically clear adhesive (OCA), and the buffer layer 410 may include a transparent resin.

The optical path control member may extend in a first direction 1D, a second direction 2D, and a third direction 3D. That is, the substrate, the electrode, and the light conversion part constituting the optical path control member may extend in the first direction 1D, the second direction 2D, and the third direction 3D, respectively.

In detail, the optical path control member may include the first direction 1D corresponding to a length or width direction of the optical path control member, the second direction 2D extending in a direction different from the first direction 1D and corresponding to the length or the width direction of the optical path control member, and the third direction 3D extending in a direction different from the first direction 1D and the second direction 2D and corresponding to a thickness direction of the optical path control member.

For example, the first direction 1D may be defined as the length direction of the optical path control member, and the second direction 2D may be defined as the width direction perpendicular to the first direction 1D, and the third direction 3D may be defined as the thickness direction of the optical path control member. Alternatively, the first direction 1D may be defined as the width direction of the optical path control member, the second direction 2D may be defined as the length direction of the optical path control member perpendicular to the first direction 1D, and the third direction 3D may be defined as the thickness direction of the optical path control member.

Hereinafter, for convenience of description, the first direction 1D will be described in the length direction of the optical path control member, the second direction 2D will be described in the width direction of the optical path control member, and the third direction 3D will be described in the thickness direction of the optical path control member.

Figure 2:
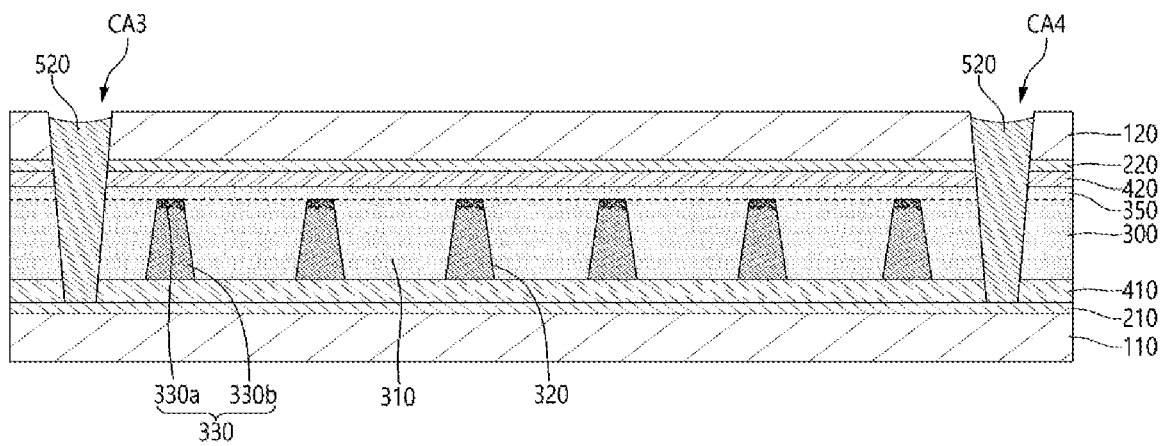
FIGS. 2 and 3 are cross-sectional views taken along line A-A' of FIG. 1.
Figure 3:
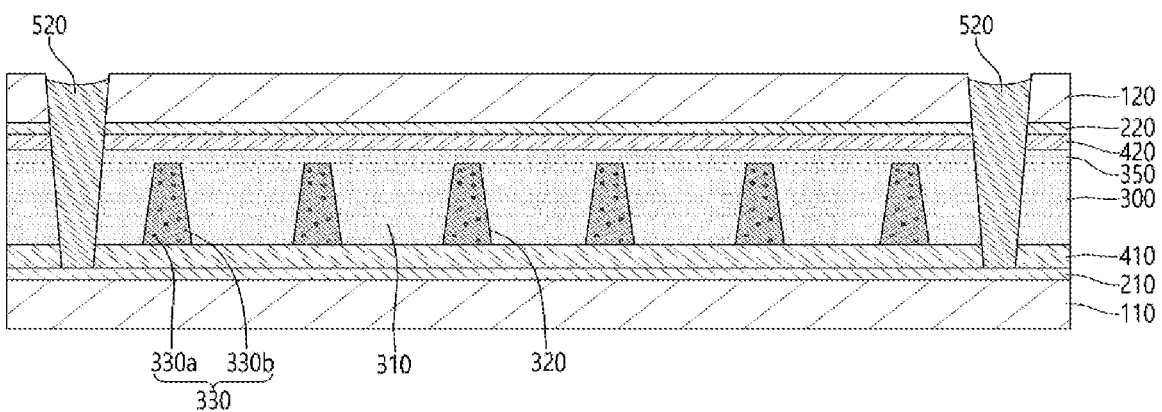

FIGS. 2 and 3 are views taken along line A-A' of FIG. 1.

Referring to FIGS. 2 and 3, the light conversion part 300 may include a plurality of partition wall parts 310, a plurality of reception parts 320, and a base part 350.

The light conversion part 300 may include the plurality of partition wall parts 310 and the reception part 320, and the partition wall part 310 and the reception part 320 may be alternately disposed with each other. That is, one reception part 320 may be disposed between two adjacent partition wall parts 310, and one partition wall part 310 may be disposed between two adjacent partition wall parts 320.

The reception part 320 may be disposed to extend in one direction. For example, the reception part 320 may be disposed to be inclined at an angle within a range set with respect to the second direction. That is, the reception part 320 may be disposed to extend in a direction between the first direction 1D and the second direction 2D.

The base part 350 may be disposed above the reception part 320. In detail, the base part 350 may be disposed between the reception part 320 and the buffer layer 420. In more detail, the base part 350 may be disposed between an upper surface of the reception part 320 and a lower surface of the buffer layer 420. Accordingly, the light conversion part 300 may be adhered to the second electrode 220 through the base part 350 and the buffer layer 420.

In addition, the adhesive layer 410 may be disposed between the partition wall part 310 and the first electrode 210, and the light conversion part 300 and the first electrode 210 may be adhered through the adhesive layer 410.

The base part 350 is a region formed while releasing a resin material constituting the partition wall part 310 and the reception part 320 from a mold member in order to form the partition wall part 310 and the reception part 320 and may include the same material as that of the partition wall part 310. That is, the base part 350 and the partition wall part 310 may be integrally formed.

The partition wall part 310 may transmit light. In addition, a light transmittance of the reception part 320 may be changed according to application of voltage.

In detail, a light conversion material 330 may be disposed in the reception part 320. The reception part 320 may have a variable light transmittance by the light conversion material 330. The light conversion material 330 may include light conversion particles 330b that move according to the application of voltage and a dispersion liquid 330a that disperses the light conversion particles 330b. In addition, the light conversion material 300 may further include a dispersant for inhibiting aggregation of the light conversion particles 330b.

The light conversion particles 330b inside the dispersion liquid 330a may move according to the application of voltage. For example, referring to FIG. 2, surfaces of the light conversion particles 330b inside the dispersion liquid 330a is charged with a negative charge, and when a positive voltage is applied through at least one of the first electrode 210 and the second electrode 220, the light conversion particles 330b are moved toward the first electrode 210 or the second electrode 220, so that the reception part 320 may serve as a light transmitting part.

For example, when the first electrode 210 is in a positive voltage or a ground voltage state, and the second electrode 220 has a positive voltage or a positive voltage greater than that of the first electrode 210, the light conversion particles 330b may move toward the second electrode 220 by attraction to aggregate.

Accordingly, the optical path control member may be driven in a share mode.

In addition, referring to FIG. 3, when a negative voltage is applied through at least one of the first electrode 210 and the second electrode 220, the light conversion particles 330b may be dispersed back inside the dispersion liquid 330a by repulsion, and the reception part 320 may serve as a light blocking part.

Accordingly, the optical path control member may be driven in a privacy mode.

The optical path control member 1000 may include at least one cutting region. In detail, the optical path control member 1000 may include a plurality of cutting regions.

For example, the optical path control member 1000 may include a first cutting region CA1, a second cutting region CA2, a third cutting region CA3, a fourth cutting region CA4, a fifth cutting region CA5, and a sixth cutting region CA6.

The first cutting region CA1 and the second cutting region CA2 may be disposed to face each other. In detail, the first cutting region CA1 and the second cutting region CA2 may be disposed to face each other in the second direction 2D.

That is, the first cutting region CA1 and the second cutting region CA2 may be disposed to face each other in the second direction while extending in the first direction.

In addition, the third cutting region CA3 and the fourth cutting region CA4 may be disposed to face each other. In detail, the third cutting region CA3 and the fourth cutting region CA4 may be disposed to face each other in the first direction 1D.

That is, the third cutting region CA3 and the fourth cutting region CA4 may be disposed to face each other in the first direction while extending in the second direction.

In addition, the fifth cutting region CA5 and the sixth cutting region CA6 may be disposed under the second cutting region CA2. In detail, the fifth cutting region CA5 and the sixth cutting region CA6 may be disposed to face each other in the second direction 2D.

That is, the fifth cutting region CA5 and the sixth cutting region CA6 may be disposed to face each other in the second direction while extending in the first direction.

In addition, the second cutting region CA12 may be disposed between the first cutting region CA1 and the fifth cutting region CA5. In addition, the fifth cutting region CA5 may be disposed between the second cutting region CA2 and the sixth cutting region CA6. That is, the first cutting region CA1, the second cutting region CA2, the fifth cutting region CA5, and the sixth cutting region CA6 may be sequentially disposed based on the second direction 2D.

The first cutting region CA1, the second cutting region CA2, the third cutting region CA3, the fourth cutting region CA4, the fifth cutting region CA5, and the sixth cutting region (CA6) may be formed by cutting the second substrate 120. In detail, the first cutting region CA1, the second cutting region CA2, the third cutting region CA3, the fourth cutting region CA4, the fifth cutting region CA5, and the sixth cutting region CA6 may be formed by cutting at least one of the second substrate 120, the second electrode 220, the buffer layer 420, the light conversion part 300, the adhesive layer 410, and the first electrode 210.

A sealing material may be disposed in the first cutting region CA1, the second cutting region CA2, the third cutting region CA3, the fourth cutting region CA4, and the fifth cutting region CA5. Accordingly, the sealing material may be disposed in the first cutting region CA1, the second cutting region CA2, the third cutting region CA3, the fourth cutting region CA4, and the fifth cutting region CA5 to form a sealing part 500.

For example, a first sealing part 510 may be disposed in the first cutting region CA1 and the second cutting region CA2, a second sealing part 520 may be disposed in the third cutting region CA3 and the fourth cutting region CA4, and a third sealing part 530 may be formed in the fifth cutting region CA5.

Meanwhile, the first cutting region CA1 may be formed at an edge of the optical path control member 1000. Accordingly, one side surface of the optical path control member 1000 may become the first sealing part 510 disposed in the first cutting region CA1.

In addition, a conductive material may be disposed in the sixth cutting region CA6. Accordingly, the conductive material may be disposed in the sixth cutting region CA6 to form a connection electrode. In detail, the conductive material may be disposed in the sixth cutting region CA6 to form a second connection electrode CE2 of the optical path control member 1000.

In addition, a first connection electrode CE1 formed by removing a part or a whole of the adhesive layer 410 may be formed on the first substrate 110, and the first connection electrode CE1 and the second connection electrode CE2 may be connected to an external printed circuit board.

The first substrate 110 and the second substrate 120 may have the same size or different sizes.

In detail, a first length extending in the first direction 1D of the first substrate 110 may have the same as or similar to a second length extending in the first direction 1D of the second substrate 120.

For example, the first length and the second length may have a size of 300 mm to 400 mm.

In addition, a first width extending in the second direction 2D of the first substrate 110 may be the same as or similar to a second width extending in the second direction of the second substrate 120.

For example, the first width and the second width may have a size of 150 mm to 200 mm.

In addition, a first thickness extending in the third direction 3A of the first substrate 110 may be the same as or similar to a second thickness extending in the third direction of the second substrate 120.

For example, the first thickness and the second thickness may have a size of 1 mm or less.

In addition, the first substrate 110 and the second substrate 120 may have different areas.

Figure 5:
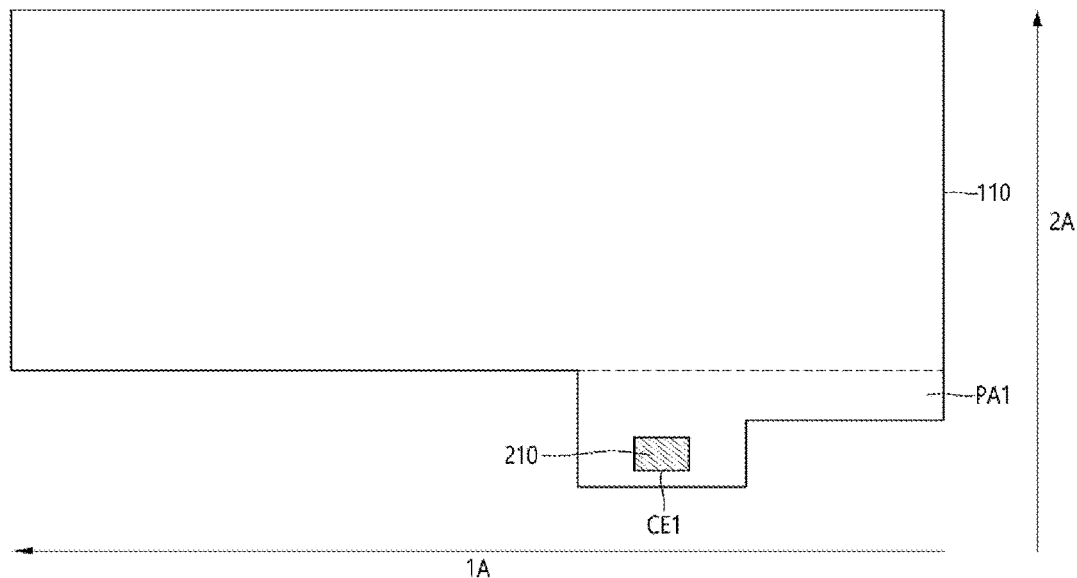
FIG. 5 is a top view of a first substrate of an optical path control member according to an embodiment.
Figure 6:
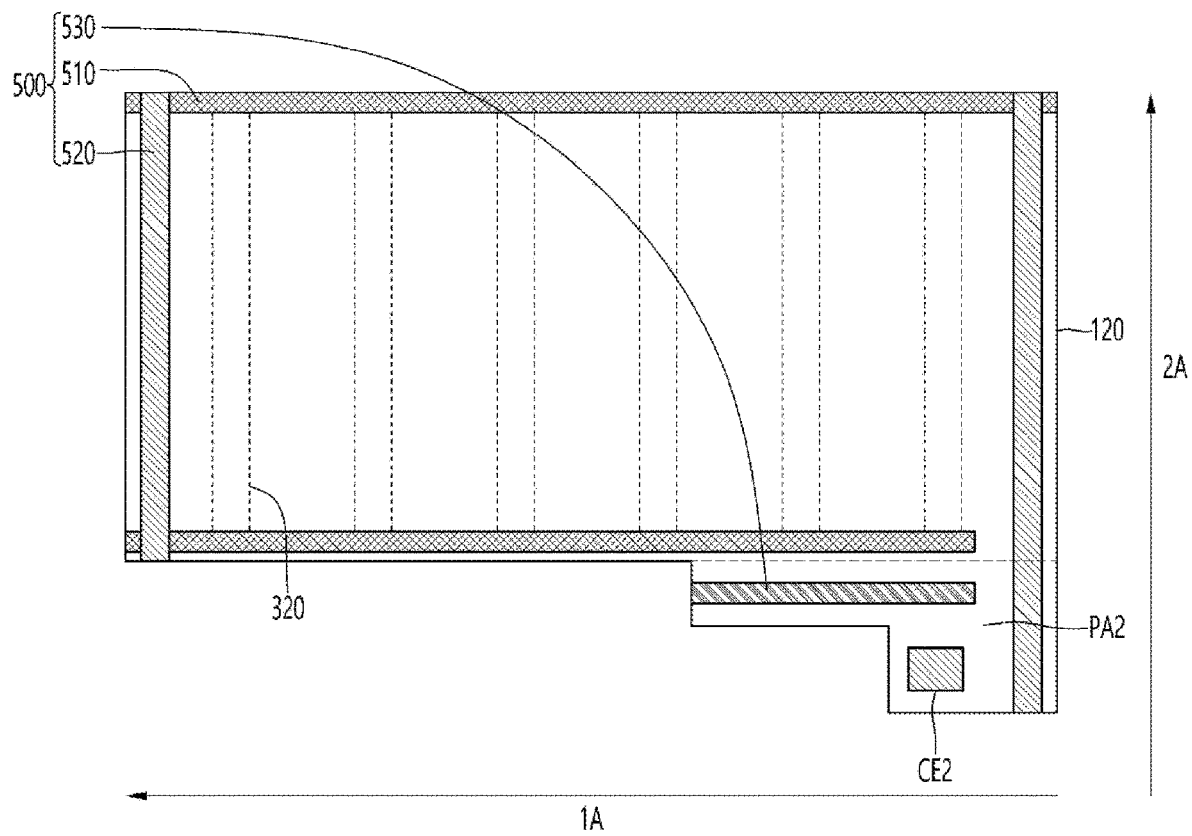
FIG. 6 is a top view of a second substrate of the optical path control member according to the embodiment.
Figure 7:
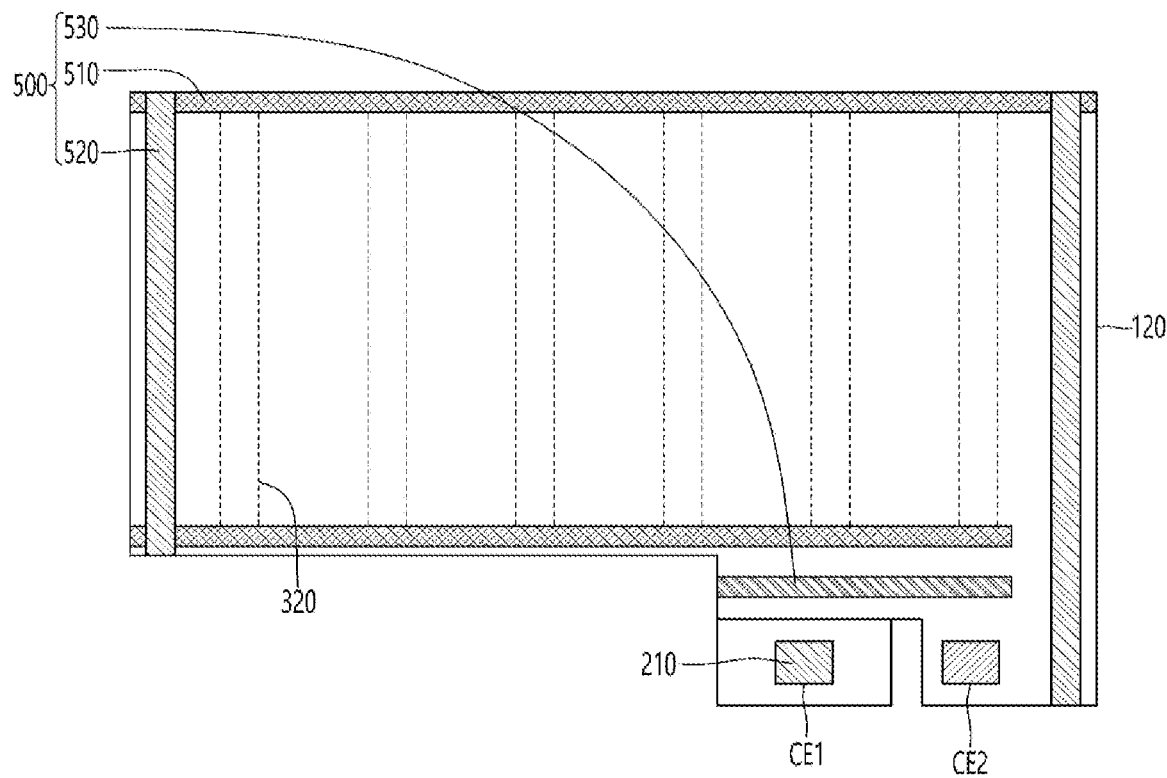
FIG. 7 is a top view in which the first substrate and the second substrate of the optical path control member according to the embodiment are laminated.

In detail, the first substrate 110 and the second substrate 120 may include protrusions. Referring to FIGS. 5 to 7, the first substrate 110 may include a first protrusion PA1, and the second substrate 120 may include a second protrusion PA2. In detail, the first substrate 110 and the second substrate 120 may include the first protrusion PA1 and the second protrusion PA2 that are disposed to be misaligned from each other.

That is, the first protrusion PA1 and the second protrusion PA2 may be disposed so as not to overlap each other in the third direction 3A.

Alternatively, the embodiment is not limited thereto, and the first protrusion PA1 and the second protrusion PA2 may include an overlapping region that overlaps each other and a non-overlapping region that does not overlap each other. That is, the first protrusion PA1 and the second protrusion PA2 may include the overlapping region that overlaps each other and the non-overlapping region that does not overlap each other in the third direction.

In this case, the first protrusion PA1 and the second protrusion PA2 may have different areas. That is, the first substrate 110 and the second substrate 120 may have different sizes by a difference in size of the protrusions.

The connection electrode connected to an external printed circuit board or a flexible printed circuit board may be formed on the first protrusion PA1 of the first substrate 110 and the second protrusion PA2 of the second substrate 120, respectively.

In detail, the first connection electrode CE1 may be disposed on the first protrusion PA1, and the second connection electrode CE2 may be disposed on the second protrusion PA2. When the first protrusion PA1 and the second protrusion PA2 are disposed at positions misaligned from each other, the first connection electrode CE1 and the second connection electrode CE2 may be disposed so as not to overlap in the third direction 3A.

A conductive material may be respectively exposed on upper surfaces of the first connection electrode CE1 and the second connection electrode CE2. For example, the first connection electrode CE1 may be formed by partially removing the adhesive layer 410 on the first electrode 210. Accordingly, the same conductive material as that of the first electrode 210 may be exposed on the first connection electrode CE1.

In addition, as described above, the second connection electrode CE2 may be formed by disposing a conductive material inside the sixth cutting region CA6. Accordingly, a conductive material the same as or different from that of the second electrode 220 may be exposed on the second connection electrode CE2.

The optical path control member may be electrically connected to the external printed circuit board or the flexible printed circuit board through the first connection electrode CE1 and the second connection electrode CE2.

For example, by disposing a pad part on the first connection electrode CE1 and the second connection electrode CE2 and by disposing a conductive adhesive including at least one of an anisotropic conductive film (ACF) and an anisotropic conductive paste (ACP) between the pad part and the printed circuit board or the flexible printed circuit board, the optical path control member may be connected thereto.

Alternatively, the conductive adhesive including at least one of the anisotropic conductive film (ACF) and the anisotropic conductive paste (ACP) may be disposed between the first connection electrode (CE1), the second connection electrode (CE2) and the printed circuit board or the flexible printed circuit board to be directly connected without the pad part.

Meanwhile, referring to FIGS. 2 and 3, the third cutting region CA3 and the fourth cutting region CA4 may be formed by removing the second substrate 120, the second electrode 220, the buffer layer 420, the light conversion part 300, and the adhesive layer 410. Accordingly, the second sealing part 520 disposed in the third cutting region CA3 and the fourth cutting region CA4 may be disposed in contact with the first electrode 210.

Figure 4:
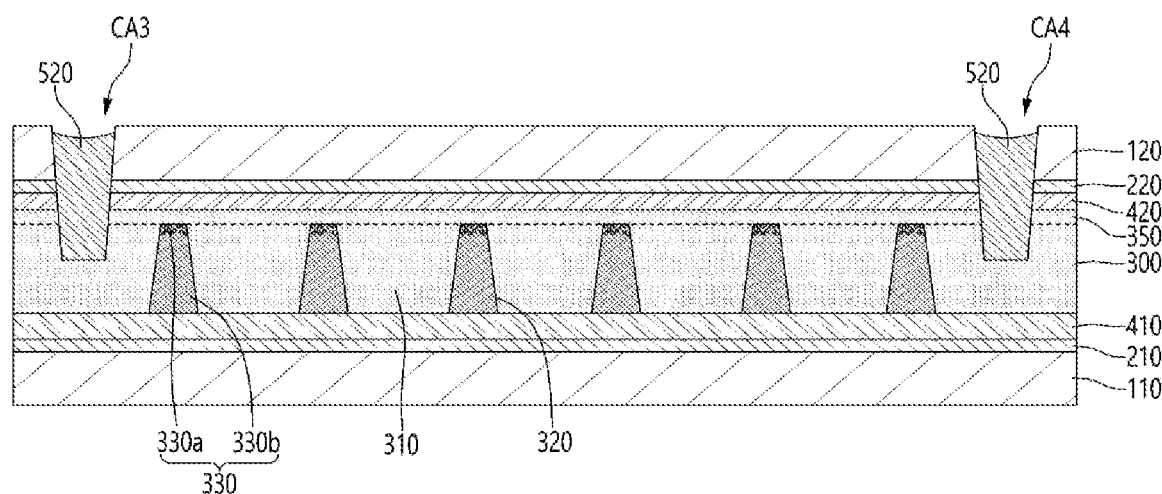
FIG. 4 is another cross-sectional view taken along line A-A' of FIG. 1.

Alternatively, referring to FIG. 4, the third cutting region CA3 and the fourth cutting region CA4 may be formed by removing some or all of the second substrate 120, the second electrode 220, the buffer layer 420, and the light conversion part 300. Accordingly, the second sealing part 520 disposed in the third cutting region CA3 and the fourth cutting region CA4 may be disposed in contact with the light conversion part 300 or the adhesive layer 410.

Meanwhile, in the configuration of the optical path control member 1000 according to the embodiment, the adhesive layer 410 is disposed to adhere the first electrode 210 and the light conversion part 300. However, since a material forming the adhesive layer 410 has an external water vapor transmission rate smaller than those of other layers, moisture may be introduced from the outside toward the light conversion material of the optical path control member through the adhesive layer 410.

Accordingly, an appearance defect of the optical path control member may occur, and a difference in driving characteristics may occur in a region of the light conversion material in which moisture has penetrated, thereby deteriorating driving characteristics of the optical path controlling member.

Therefore, the optical path control member capable of improving sealing characteristics of the adhesive layer of the optical path control member will be described in detail below.

First, referring to FIGS. 8 to 17, the first cutting region CA1 in which the first sealing part 510 is disposed will be described.

FIGS. 8 to 17 are views for describing the first cutting region CA1 and the first sealing part 510 disposed in the first cutting region CA1.

Figure 8:
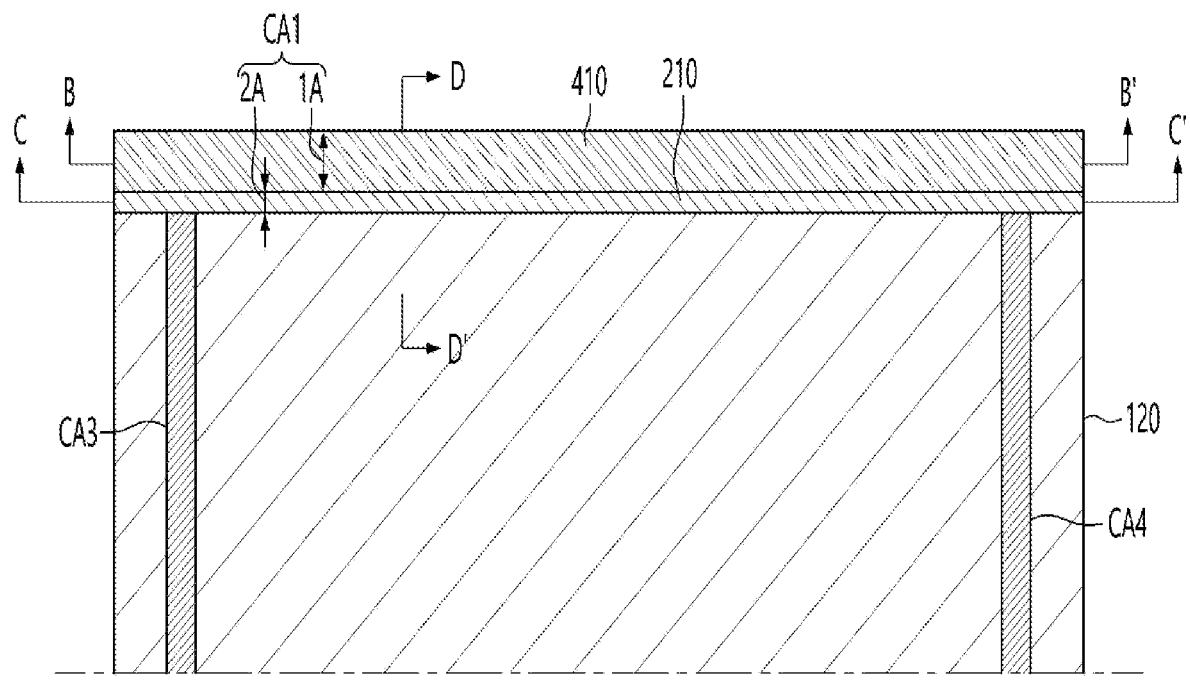
FIG. 8 is a top view of region A of FIG. 1 for describing a first cutting region of the optical path control member according to the embodiment.

FIG. 8 is a top view for describing the first cutting region of the optical path control member 1000.

Referring to FIG. 8, the first cutting region CA1 may extend in the first direction 1D. That is, a length direction of the first cutting region CA1 may be the first direction.

The first cutting region CA1 may be formed by partially removing the optical path control member 1000. The first cutting region CA1 may be formed by removing at least one of the second substrate 120, the second electrode 220, the buffer layer 420, the light conversion part 300, and the adhesive layer 410.

In detail, the first cutting region CA1 may be defined as two regions according to a degree of cutting. In detail, the first cutting region CA1 may include a first region 1A from which the second substrate 120, the second electrode 220, the buffer layer 420, and the light conversion part 300 are removed and a second region 2A from which the second substrate 120, the second electrode 220, the buffer layer 420, the light conversion part 300, and the adhesive layer 410.

That is, the adhesive layer 410 may not be removed from the first region 1A, and the adhesive layer 410 may be partially or completely removed from the second region 2A. Accordingly, the adhesive layer 410 may be formed in the first region 1A, and the second region 2A may be formed by removing partially or entirely the adhesive layer 410.

A cutting depth of the first region 1A and the second region 2A may be different. Accordingly, the first region 1A and the second region 2A may have different depths. Accordingly, the first cutting region CA1 may include the first region 1A to which the adhesive layer 410 is exposed and the second region 2A including a step portion SA having a step difference from the first region.

For example, the adhesive layer 410 may be exposed in the first region 1A, and the first electrode 210 may be exposed in the second region 2A. That is, a lower surface of the first cutting region CA1 may have a step difference in the first region 1A and the second region 2A.

The second region 2A may be a region where a laser is irradiated in order to form the first cutting region CA1. That is, a part of the second substrate 120, the second electrode 220, the buffer layer 420, the light conversion part 300, and the adhesive layer 410 may be removed from the optical path control member 1000 by irradiating the laser along the second region 2A. Accordingly, the first cutting region CA1 may be formed in the optical path control member 1000.

Figure 9:
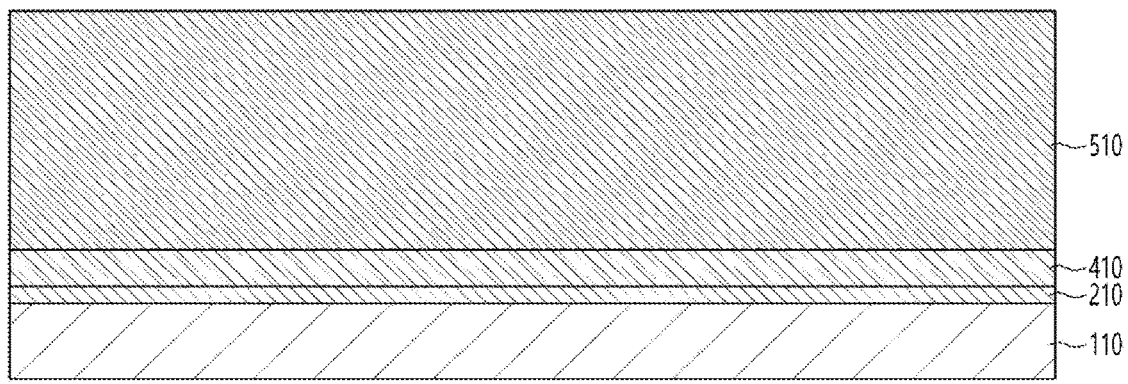
FIG. 9 is a cross-sectional view taken along line B-B' of FIGS. 1 and 8.
Figure 10:
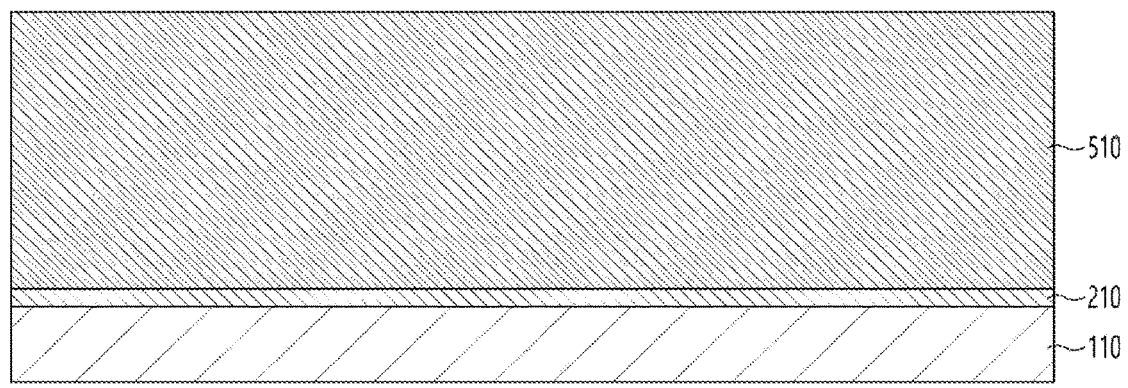
FIG. 10 is a cross-sectional view taken along line C-C' of FIGS. 1 and 8.
Figure 11:
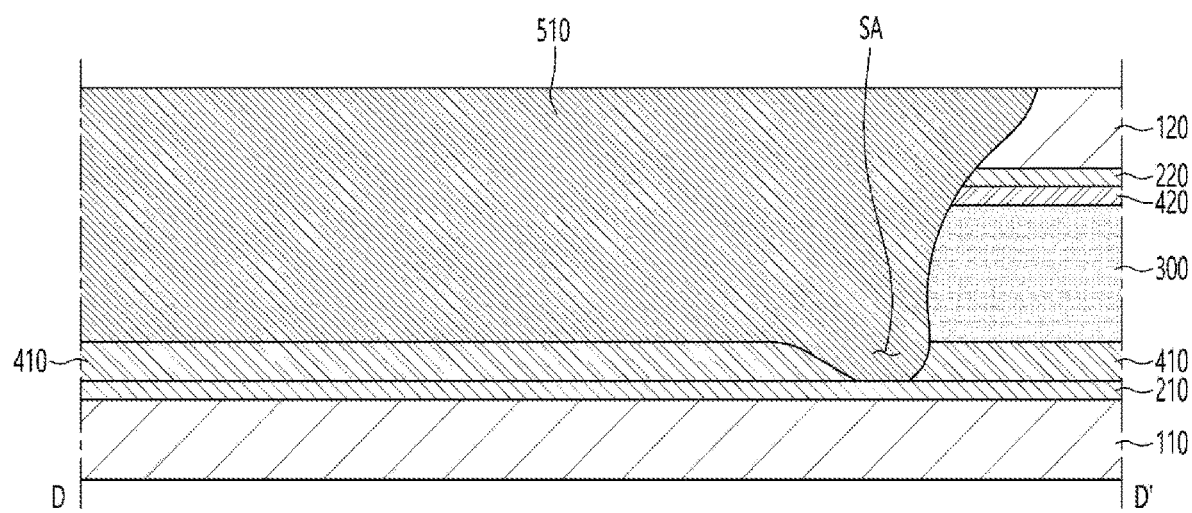
FIGS. 11 and 12 are cross-sectional views taken along line D-D' of FIG. 8.

FIG. 9 is a cross-sectional view taken along line B-B' of FIGS. 1 and 8, FIG. 10 is a cross-sectional view taken along line C-C' of FIGS. 1 and 8, and FIG. 11 is a cross-sectional view taken along line D-D' of FIG. 8. FIGS. 9 to 11 are cross-sectional views of a case in which the sealing part is filled in the first cutting region CA1.

Referring to FIG. 9, the first sealing part 510 disposed in the first region 1A of the first cutting region CA1 may be disposed in contact with the adhesive layer 410. In addition, referring to FIG. 10, the first sealing part 510 disposed in the second region 2A of the first cutting region CA1 may be disposed in contact with the first electrode 210.

That is, the first sealing part 510 may be disposed in contact with different layers according to a position in the first cutting region CA1.

Accordingly, referring to FIG. 11, when moisture is penetrated through the adhesive layer 410, the moisture may move from the adhesive layer 410 toward the light conversion part 300 and then may be blocked by the first sealing part 510 disposed adjacent to the light conversion part 300.

That is, it is possible to inhibit or minimize the movement of moisture penetrated through the adhesive layer 410 to the light conversion part 300 by the first sealing part 510.

In detail, referring to FIG. 11, the first sealing part 510 disposed in the first cutting region CA1 may include a step portion SA. The step portion SA may short-circuit the first adhesive layer 410, and moisture penetration through the adhesive layer 410 may be easily inhibited by disposing the first sealing part 510 in the step portion SA.

Referring to FIG. 11, an inner surface of the first cutting region CA1 may include an inclined surface. In addition, the inner surface of the first cutting region CA1 may include a curved surface. That is, the inner surface of the first cutting region CA1 may include an inclined surface including a curved surface.

A width of the first cutting region may increase while extending from the first substrate 110 toward the second substrate 120. Here, the width of the first cutting region may extend in the second direction. That is, the inner surface of the first cutting region CA1 may be inclined in a direction in which the width of the first cutting region CA1 increases while extending from the first substrate 110 toward the second substrate 120.

In addition, a side surface of the adhesive layer 410 among the inner surfaces of the first cutting region CA1 may be formed in a concave shape. That is, the side surface of the adhesive layer 410 is a region in direct contact with the laser for forming the first cutting region CA1, and a large amount of heat according to the laser is applied compared to other layers, thereby forming the concave shape.

In addition, an inclination angle of the inner surface of the first cutting region CA1 may be changed while extending from the first substrate 110 toward the second substrate 120. For example, the inclination angle of the inner surface of the first cutting region CA1 may be greater than an inclination angle in the first substrate 110, and an inclination angle of the second electrode 220 and the buffer layer 420 may be greater than an inclination angle in the second substrate 120 or the light conversion part 300.

Figure 12:
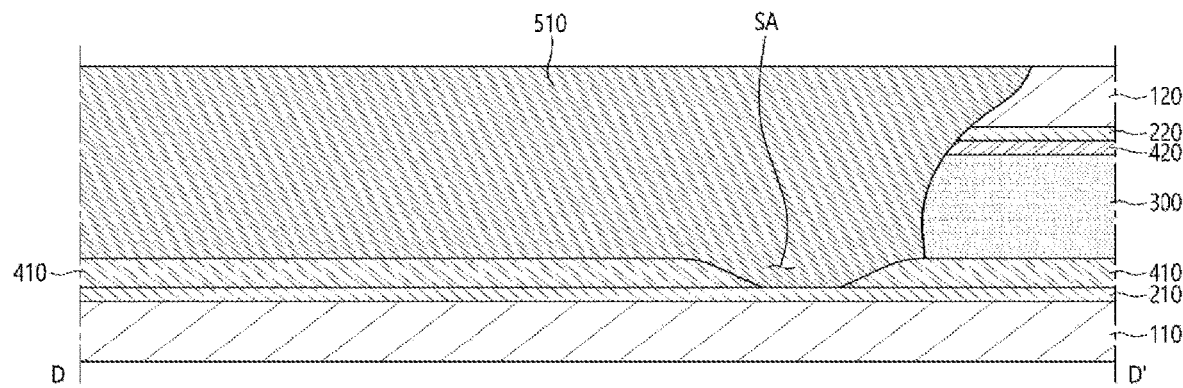

In addition, referring to FIG. 12, a region where the first electrode 210 is exposed in the first cutting region CA1 may be spaced apart from the inner surface of the first cutting region CA1. That is, unlike FIG. 11, the adhesive layer 410 may be disposed between the region where the first electrode 210 is exposed in the first cutting region CA1 and the inner surface of the first cutting region.

Figure 13:
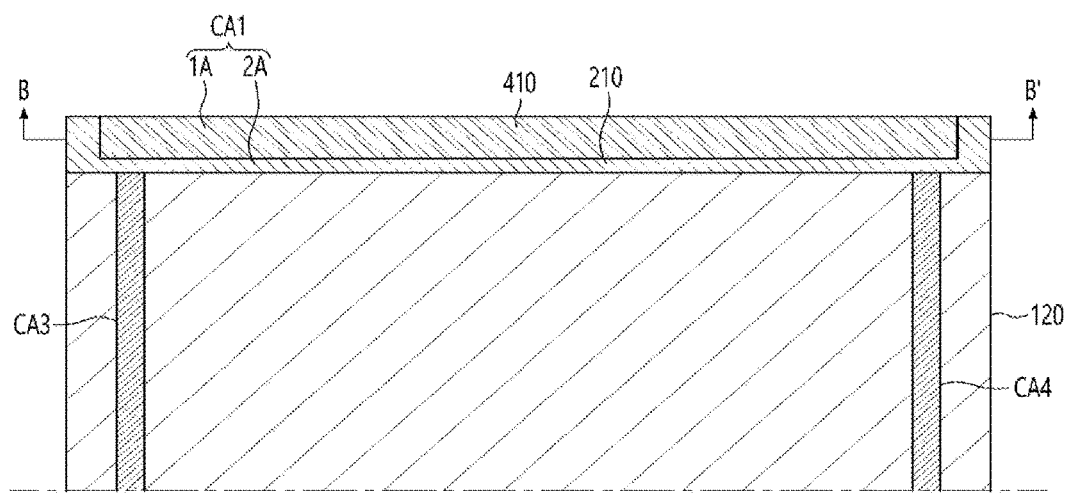
FIG. 13 is another top view of region A of FIG. 1 for describing the first cutting region of the optical path control member according to the embodiment.

FIG. 13 is another top view for describing the first cutting region of the optical path control member 1000.

Referring to FIG. 13, the first cutting region CA1 may be formed by removing at least one of the second substrate 120, the second electrode 220, the buffer layer 420, the light conversion part 300, and the adhesive layer 410.

In detail, the first cutting region CA1 may be defined as two regions according to the degree of cutting. In detail, the first cutting region CA1 may include a first region 1A from which the second substrate 120, the second electrode 220, the buffer layer 420, and the light conversion part 300 are removed and a second region 2A from which the second substrate 120, the second electrode 220, the buffer layer 420, the light conversion part 300, and the adhesive layer 410.

That is, the adhesive layer 410 may be formed in the first region 1A, and the second region 2A may be formed by partially or entirely removing the adhesive layer 410.

Accordingly, the adhesive layer 410 may be exposed in the first region 1A, and the first electrode 210 may be exposed in the second region 2A. That is, a lower surface of the first cutting region CA1 may have a step difference in the first region 1A and the second region 2A.

The second region 2A may also be formed at at least one of both ends of the first cutting region CA1 in the first direction 1D. For example, the second region 2A may be formed at only one end of both ends of the first cutting region CA1 in the first direction 1D or may be formed at both ends of the first cutting region CA1.

Accordingly, when the first cutting region CA1 is formed in the optical path control member 1000, it may be easily cut by increasing a region to which the laser is irradiated.

As an example, the second region 2A may be formed to extend in the second direction 2D from both ends of the first cutting region CA1 in the first direction 1D. Accordingly, the second region 2A may be disposed to surround the first region 1A.

Figure 14:
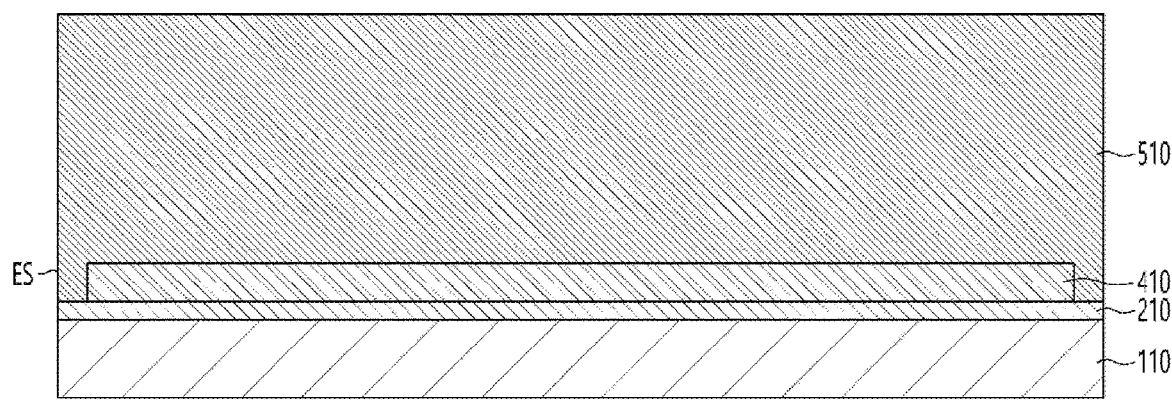
FIG. 14 is a cross-sectional view taken along line B-B' of FIGS. 1 and 13.

FIG. 14 is a cross-sectional view taken along line B-B' of FIGS. 1 and 11. FIG. 14 is a cross-sectional view of a case in which a sealing part is filled in the first cutting region CA1.

Referring to FIGS. 13 and 14, the first sealing part 510 disposed in the first region 1A of the first cutting region CA1 may be disposed in contact with the adhesive layer 410. In addition, the first sealing part 510 disposed in the second region 2A of the first cutting region CA1 may be disposed in contact with the first electrode 210.

That is, the first sealing part 510 may be disposed in contact with different layers according to a position in the first cutting region CA1.

Accordingly, referring to FIGS. 13 and 14, the adhesive layer 410 of an outer surface ES of the optical path control member 1000 is removed, and the first sealing part 510 is disposed in a region where the adhesive layer 410 is removed. Therefore, it is possible to inhibit or minimize penetration of moisture into the optical path controlling member through the adhesive layer on the outer surface of the optical path controlling member 1000.

Figure 15:
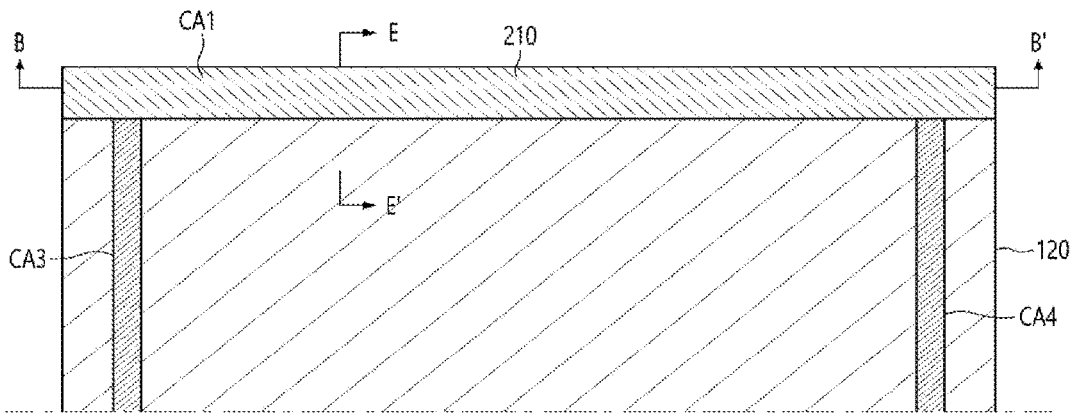
FIG. 15 is still another top view of region A of FIG. 1 for describing the first cutting region of the optical path control member according to the embodiment.

FIG. 15 is another top view for describing the first cutting region of the optical path control member 1000.

Referring to FIG. 15, the first cutting region CA1 may be formed by removing at least one of the second substrate 120, the second electrode 220, the buffer layer 420, the light conversion part 300, and the adhesive layer 410.

That is, the laser may be irradiated to all regions where the first cutting region CA1 is to be formed.

Therefore, since the first cutting region CA1 is formed by removing all of the second substrate 120, the second electrode 220, the buffer layer 420, the light conversion part 300, and the adhesive layer 410, the first electrode 210 may be exposed in the first cutting region CA1. That is, the first electrode 210 may be exposed on a lower surface of the first cutting region CA1 without a step difference.

Figure 16:
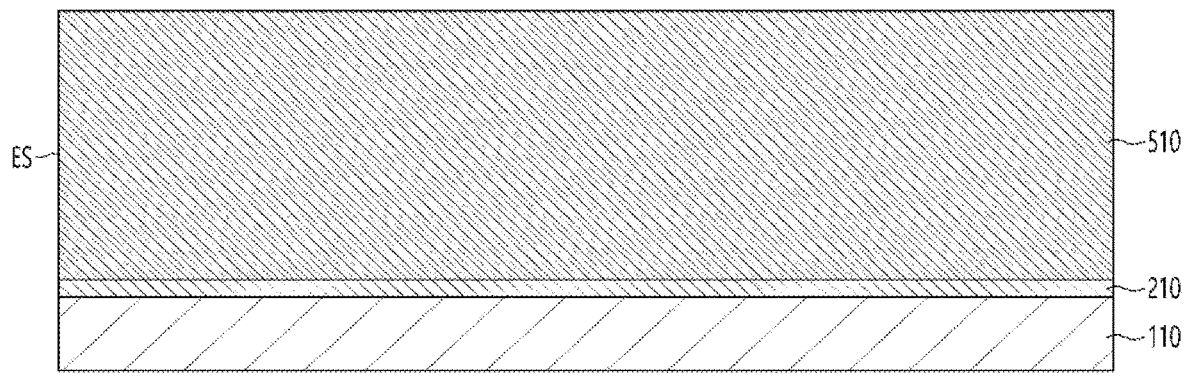
FIG. 16 is a cross-sectional view taken along line B-B' of FIGS. 1 and 15.
Figure 17:
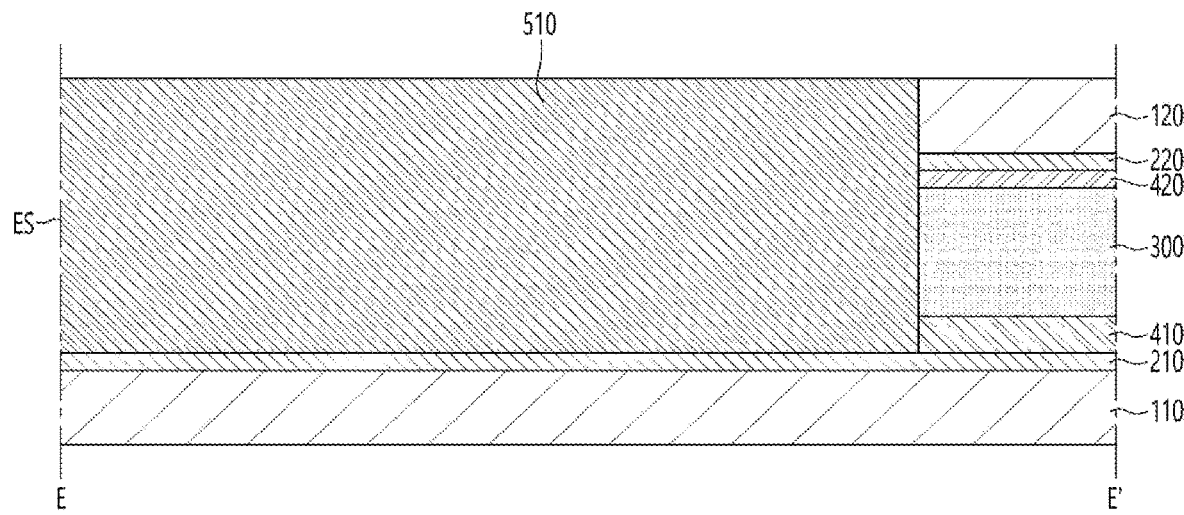
FIG. 17 is a cross-sectional view taken along line E-E' of FIG. 15.

FIG. 16 is a cross-sectional view taken along line B-B' of FIGS. 1 and 15, FIG. 17 is a cross-sectional view taken along line E-E' of FIG. 15, and FIGS. 16 and 17 are cross-sectional views of a case in which a sealing part is filled in the first cutting region CA1.

Referring to FIGS. 16 and 17, the first sealing part 510 disposed in the first cutting region CA1 may be disposed in contact with the first electrode 210. That is, all of the first sealing parts 510 disposed in the first cutting region CA1 may be disposed in contact with the first electrode 210.

Accordingly, referring to FIGS. 16 and 17, the outer surface ES of the optical path control member 1000 formed by the first cutting region CA1 in the optical path control member 1000 may be formed by the first sealing part 510.

Therefore, when moisture penetrates into the optical path control member through the outer surface of the optical path control member 1000, it is possible to inhibit or minimize penetration of moisture into the optical path control member through the first sealing part 510.

Meanwhile, the first sealing part 510 and the second sealing part 520. may be connected in a region where the first cutting region CA1, the third cutting region CA3, and the fourth cutting region CA4 overlap. That is, the first sealing part 510 and the second sealing part 520 may be integrally formed in the region where the first cutting region CA1, the third cutting region CA3, and the fourth cutting region CA4 overlap.

The first sealing part 510 may include a photo-curable material. In addition, the sealing material of the first sealing part 510 may include a material having low reactivity with the light conversion material 330. For example, the sealing material of the first sealing part 510 may include polyurethane acrylate.

The first sealing part 520 may seal the reception part 320 of the light converting part 300. That is, while inhibiting the light conversion material 330 accommodated in the reception part 320 from leaking to the outside, it is possible to inhibit impurities that may permeate from the outside from penetrating into the light conversion part 300.

That is, the first sealing part 520 may seal the light conversion material 300 by sealing the injection part of an injection part and a suction part of the reception part 320.

The first sealing part 510 may be disposed while completely filling the first cutting region CA1 or may be disposed in a height lower than a depth of the first cutting region CA1. Accordingly, an upper surface of the first sealing part 510 may be disposed in a height lower than an upper surface of the second substrate 120. That is, a step difference may be formed between the upper surface of the first sealing part 510 and the upper surface of the second substrate 120. In addition, the upper surface of the first sealing part 510 may be formed in a concave shape.

Hereinafter, the second cutting region CA2, the fifth cutting region CA5, and the sixth cutting region CA6 will be described.

FIGS. 18 to 27 are views for describing the second cutting region CA2, the fifth cutting region CA5, the sixth cutting region CA6, the first sealing part 510 disposed in the second cutting region CA2, the third sealing part 530 disposed in the fifth cutting region CA5, and a conductive material 600 disposed in the sixth cutting region CA6.

Figure 18:
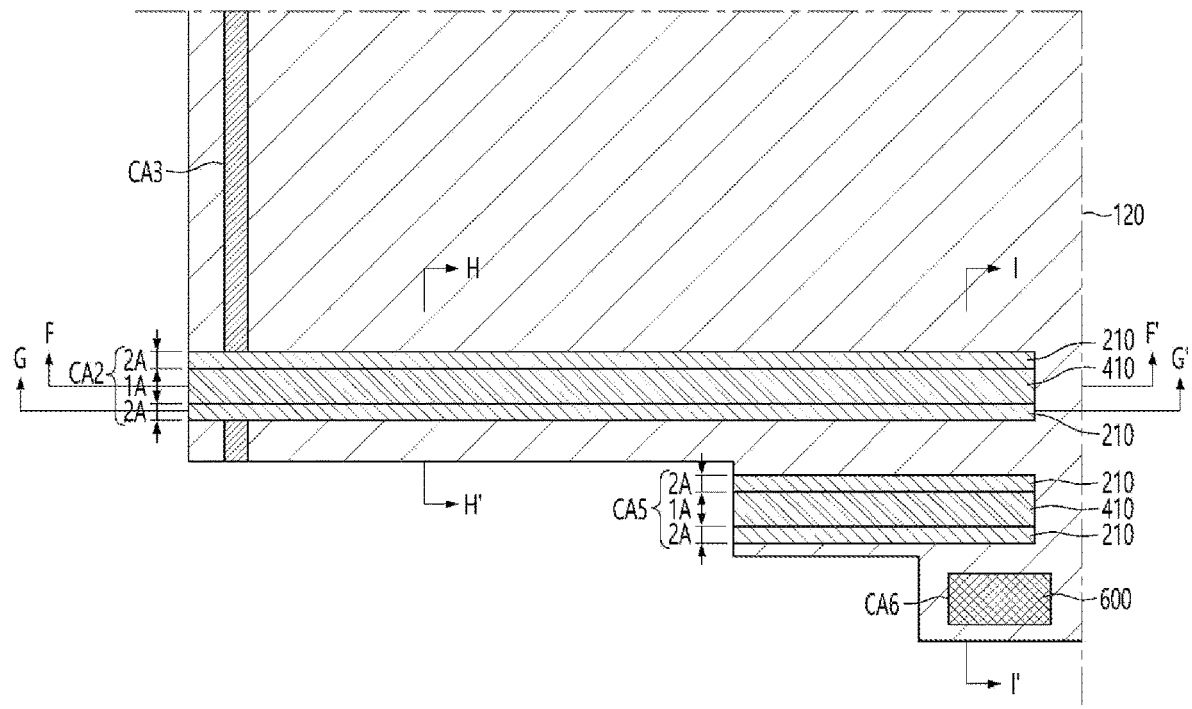
FIG. 18 is a top view of region G of FIG. 1 for describing second, fifth, and sixth cutting regions of the optical path control member according to the embodiment.

Referring to FIG. 18, the second cutting region CA2 may extend in a length direction of the first direction 1D.

The second cutting region CA2 may be formed by partially removing the optical path control member 1000. The second cutting region CA2 may be formed by removing at least one of the second substrate 120, the second electrode 220, the buffer layer 420, the light conversion part 300, and the adhesive layer 410.

In detail, the second cutting region CA2 may be defined as two regions according to the degree of cutting. In detail, the second cutting region CA2 may include a first region 1A from which the second substrate 120, the second electrode 220, the buffer layer 420, and the light conversion part 300 are removed and a second region 2A from which the second substrate 120, the second electrode 220, the buffer layer 420, the light conversion part 300, and the adhesive layer 410.

A cutting depth of the first region 1A and the second region 2A may be different. Accordingly, the first region 1A and the second region 2A may have different depths. Accordingly, the first cutting region CA1 may include the first region 1A to which the adhesive layer 410 is exposed and the second region 2A including a step portion SA having a step difference from the first region.

The second region 2A may include a plurality of regions. For example, the second region 2A may include a plurality of second regions 2A spaced apart from each other. In addition, the first region 1A may be disposed between the second regions 2A.

Accordingly, the adhesive layer 410 may be exposed in the first region 1A, and the first electrode 210 may be exposed in the second region 2A. That is, a lower surface of the second cutting region CA2 may have a step difference in the first region 1A and the second region 2A.

The second region 2A may be a region where a laser is irradiated in order to form the first cutting region CA1. That is, a part of the second substrate 120, the second electrode 220, the buffer layer 420, the light conversion part 300, and the adhesive layer 410 may be removed from the optical path control member 1000 by irradiating the laser along the second region 2A. Accordingly, the first cutting region CA1 may be formed in the optical path control member 1000.

Figure 19:
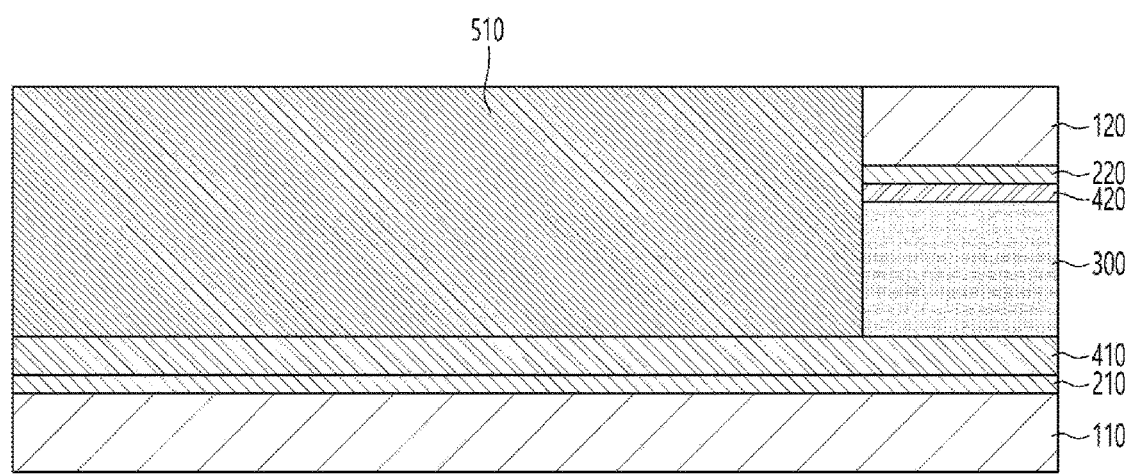
FIG. 19 is a cross-sectional view taken along line F-F' of FIGS. 1 and 18.
Figure 20:
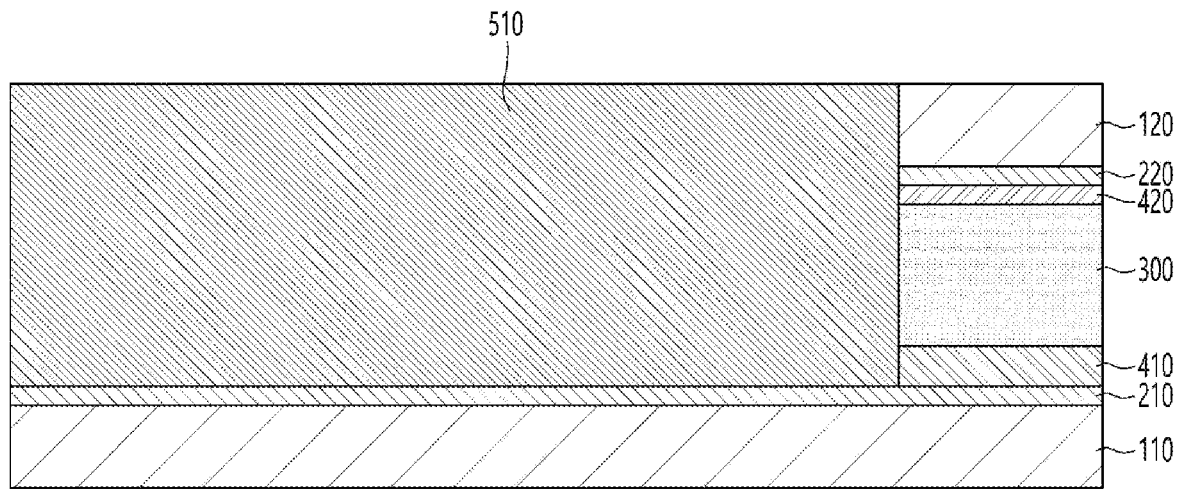
FIG. 20 is a cross-sectional view taken along line G-G' of FIGS. 1 and 18.
Figure 21:
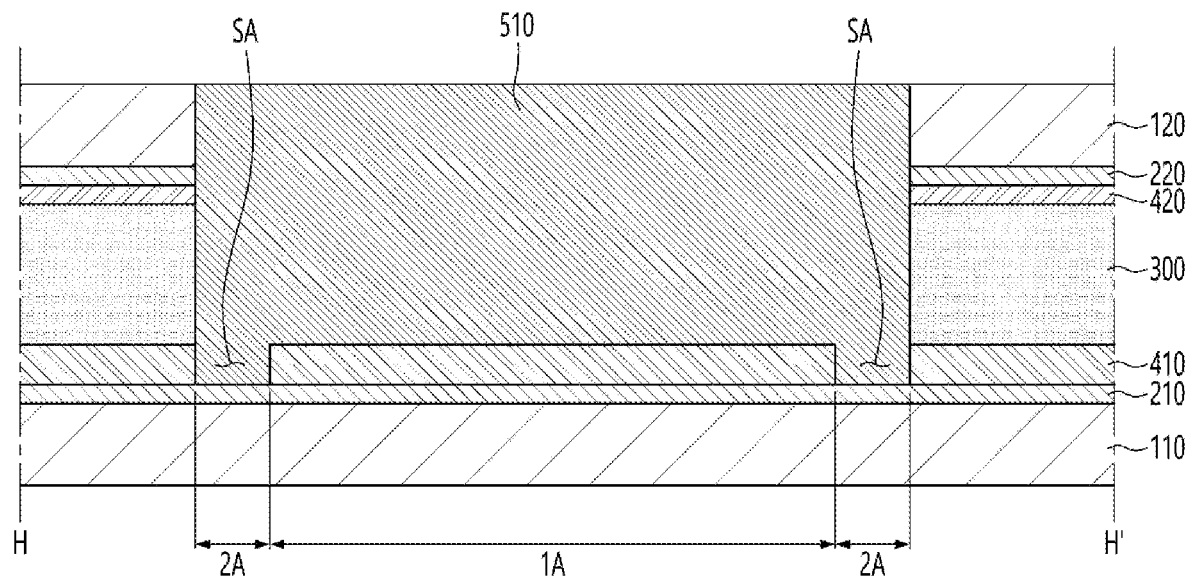
FIG. 21 is a cross-sectional view taken along line H-H' of FIG. 18.
Figure 22:
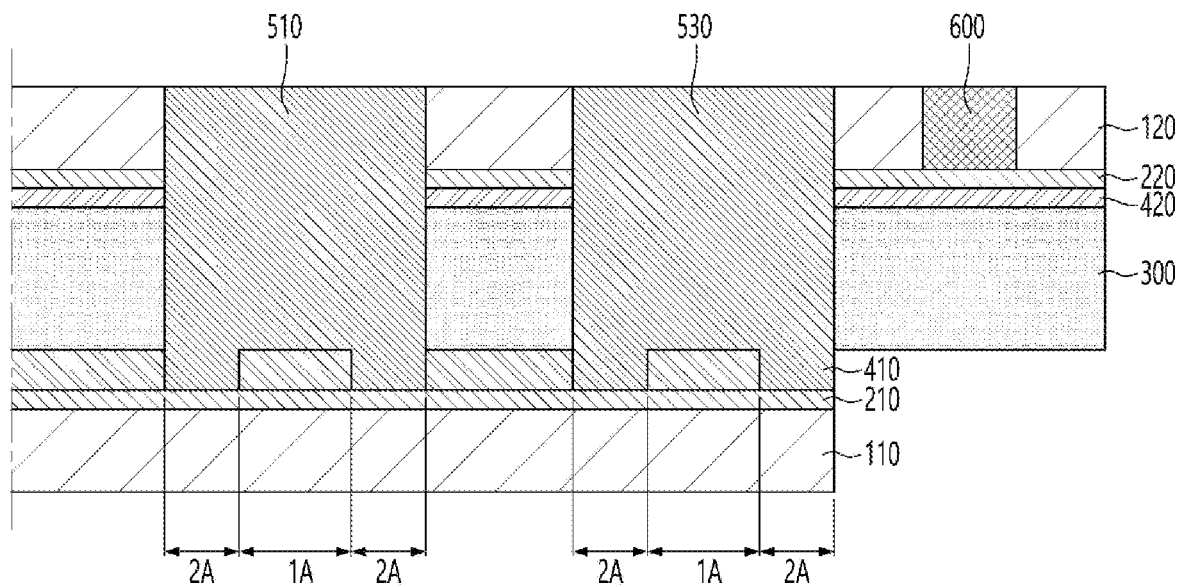
FIGS. 22 to 23 are cross-sectional views taken along line I-I' of FIG. 18
Figure 23:
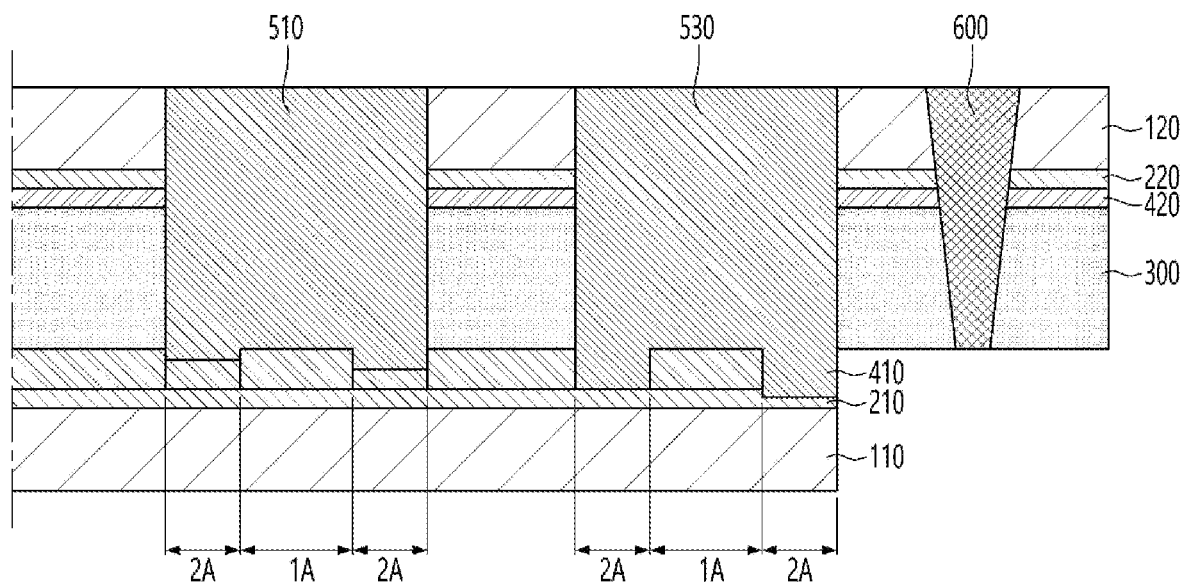

FIG. 19 is a cross-sectional view taken along line F-F' of FIGS. 1 and 18, FIG. 20 is a cross-sectional view taken along line G-G' of FIGS. 1 and 18, FIG. 21 is a cross-sectional view taken along line H-H' of FIG. 18, and FIGS. 22 and 23 are cross-sectional views taken along line I-I' of FIG. 18. FIGS. 19 to 23 are cross-sectional views of a case in which a sealing part is filled in the second cutting region CA2 and the fifth cutting region CA5 and a conductive material is filled in the sixth cutting region CA6.

Referring to FIG. 19, the first sealing part 510 disposed in the first region 1A of the second cutting region CA2 may be disposed in contact with the adhesive layer 410. In addition, referring to FIG. 20, the first sealing part 510 disposed in the second region 2A of the second cutting region CA2 may be disposed in contact with the first electrode 210.

That is, the first sealing part 510 may be disposed in contact with different layers according to a position in the first cutting region CA1.

Accordingly, referring to FIG. 21, when moisture is penetrated through the adhesive layer 410, it is possible to inhibit or minimize penetration of moisture into the light conversion part 300 by the first sealing part 510 disposed between the adhesive layers.

In addition, since the first sealing part 510 is disposed in all of the second regions 2A spaced apart from each other, it is possible to double block the penetration of moisture. Therefore, when moisture is permeated into the optical path control member through the adhesive layer, it is possible to inhibit or minimize moisture from moving to the light conversion part 300.

FIGS. 22 and 23 are cross-sectional views obtained by cutting the second cutting region, the fifth cutting region, and the sixth cutting region. FIGS. 22 and 23 are cross-sectional views of a case in which a sealing part is filled in the second cutting region CA2 and the fifth cutting region CA5 and a conductive material is filled in the sixth cutting region CA6.

The fifth cutting region CA5 may be disposed to be spaced apart in an opposite direction of the second cutting region CA2 and the first cutting region CA1 on the second cutting region CA2.

The fifth cutting region CA5 may include a first region 1A and a second region 2A in the same manner as the second cutting region CA2. Accordingly, the third sealing part 530 disposed inside the fifth cutting region CA5 may be disposed in contact with the adhesive layer 410 and the first electrode 210 inside the fifth cutting region CA5.

That is, the adhesive layer 410 may be formed in the first region 1A, and the second region 2A may be formed by partially or entirely removing the adhesive layer 410.

A length of the fifth cutting region CA5 in the first direction may be smaller than a length of the second cutting region CA2. In addition, the third sealing part 530 may include a material the same as or similar to that of the first sealing part 510.

In addition, the conductive material 600 may be disposed in the sixth cutting region CA6. The sixth cutting region CA6 may be a region where the above-described second connection electrode CE2 is disposed. The conductive material 600 may include a metal paste. For example, the conductive material 600 may include a paste composition including a metal the same as or different from those of the first electrode 210 and the second electrode 220.

A height of the sixth cutting region CA6 may be different from a height of at least one of the first cutting region CA1, the second cutting region CA2, and the fifth cutting region CA5. For example, as shown in FIGS. 22 and 23, the height of the sixth cutting region CA6 may be smaller than heights of the first cutting region CA1, the second cutting region CA2, and the fifth cutting region CA5.

Referring to FIG. 23, the second regions of the second cutting region CA2 and the second region of the fifth cutting region CA5 may have different depths. In detail, thicknesses of the adhesive layers 410 disposed in the second regions 2A of the second cutting region CA2 and the fifth cutting region CA5 may be different.

In detail, the thicknesses of the adhesive layers 410 disposed in the second regions 2A of the second cutting region CA2 and the fifth cutting region CA5 may vary depending on a distance from the first cutting region CA1. In more detail, the thicknesses of the adhesive layers 410 disposed in the second regions 2A of the second cutting region CA2 and the fifth cutting region CA5 may be greater as it is closer to the first cutting region CA1.

That is, in the second region 2A of the fifth cutting region CA5, all of the adhesive layer 410 may be removed by increasing an intensity or irradiation time of the laser, and in the second region 2A of the second cutting region CA2, a part of the adhesive layer 410 may remain by making the intensity or irradiation time of the laser relatively small.

When the second cutting region CA12 and the fifth cutting region CA5 are formed using the laser, the first electrode 210 disposed under the adhesive layer 410 may be removed together due to an error during a process.

Therefore, in the second cutting region CA2, it is possible to inhibit the first electrode 210 from being removed by reducing the intensity or time of the laser to partially remain the adhesive layer 410. Accordingly, by inhibiting the reception part of the light conversion part 300, that is, the first electrode 210 of the second cutting region CA2 disposed adjacent to the light conversion material 300 from being removed, it is possible to inhibit deterioration of the driving characteristics of the optical path control member.

In addition, in the fifth cutting region CA5, by removing all the adhesive layers by increasing the intensity or time of the laser, and by partially removing the first electrode 210 according to the intensity of the laser, it is possible to increase an area of the third sealing part 530. Accordingly, it is possible to effectively inhibit the penetration of moisture that may penetrate from the outside of the optical path control member. In addition, since the fifth cutting region CA5 is a region far from the light conversion material 300, even though a part of the first electrode 210 is partially removed during a laser process, the driving characteristics may not be significantly affected.

Figure 24:
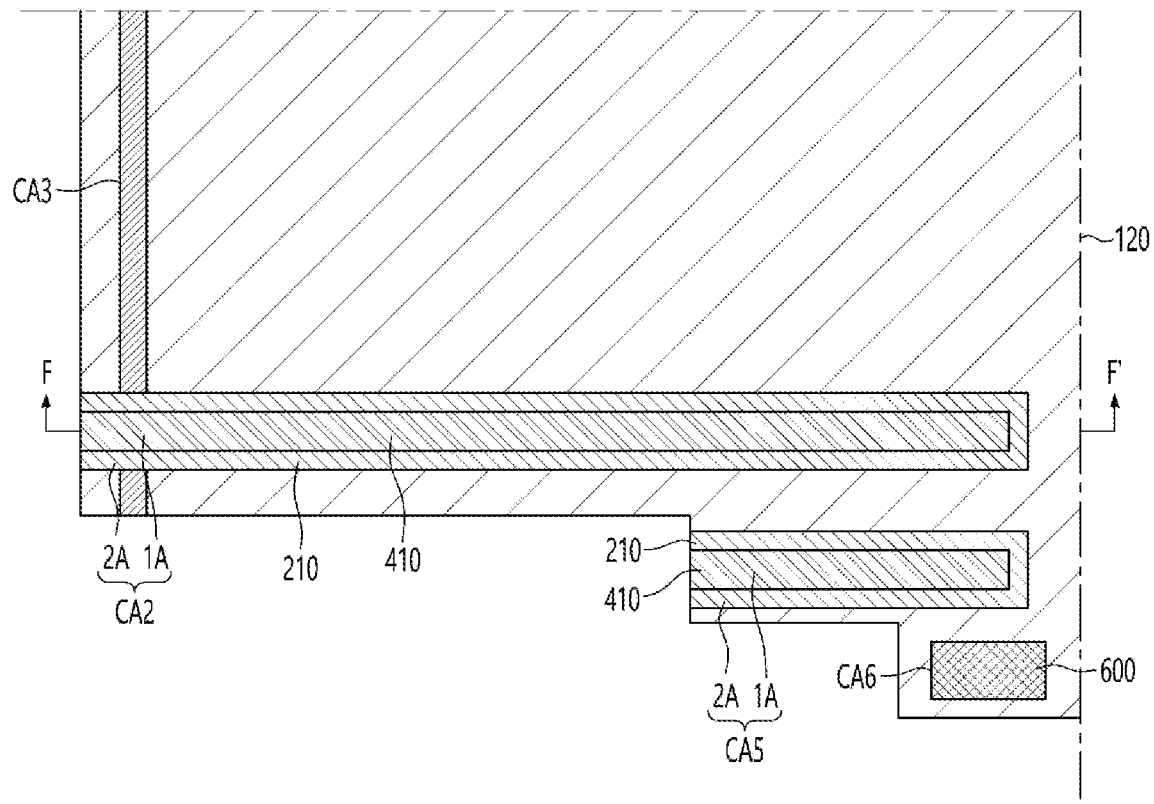
FIG. 24 is another top view of region G of FIG. 1 for describing second, fifth, and sixth cutting regions of the optical path control member according to the embodiment.
Figure 25:
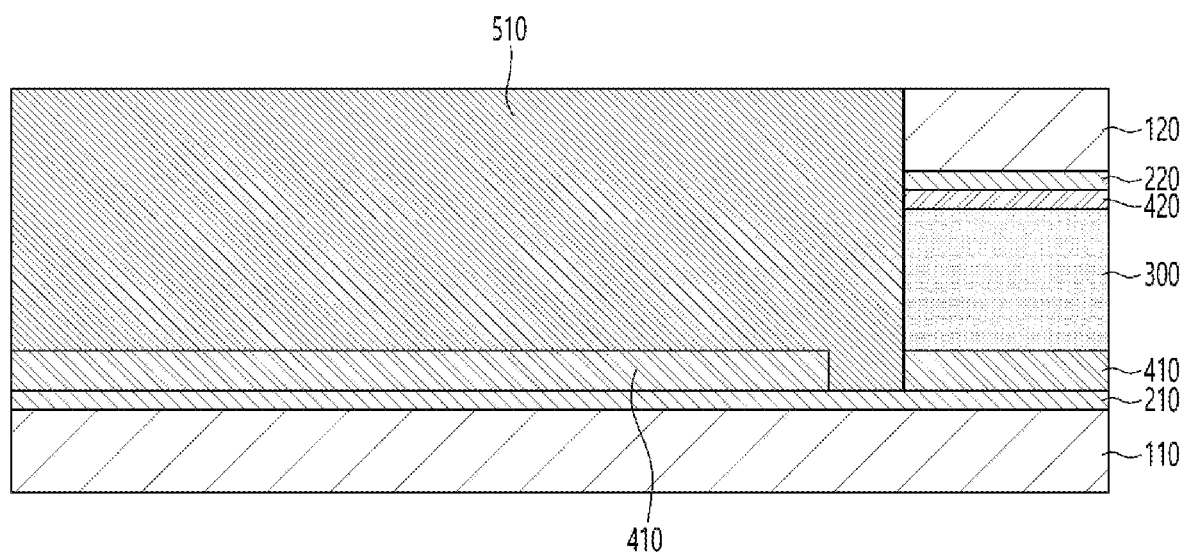
FIG. 25 is a cross-sectional view taken along line F-F' of FIGS. 1 and 24.

FIGS. 24 and 25 are views for describing a second cutting region and a fifth cutting region of the optical path control member 1000.

Referring to FIG. 24, the second cutting region CA2 and the fifth cutting region CA5 may be formed by removing at least one of the second substrate 120, the second electrode 220, the buffer layer 420, the light conversion part 300, and the adhesive layer 410.

In detail, the second cutting region CA2 and the fifth cutting region CA5 may be defined as two regions according to the degree of cutting. In detail, the second cutting region CA2 and the fifth cutting region CA5 include a first region 1A from which the second substrate 120, the second electrode 220, the buffer layer 420, and the light conversion part 300 are removed and a second region 2A from which the second substrate 120, the second electrode 220, the buffer layer 420, the light conversion part 300, and the adhesive layer 410.

Accordingly, the adhesive layer 410 may be exposed in the first region 1A, and the first electrode 210 may be exposed in the second region 2A. That is, a lower surface of the second cutting region CA2 may have a step difference in the first region 1A and the second region 2A.

The second region 2A may also be formed at at least one of both ends of the second cutting region CA2 and the fifth cutting region CA5 in the first direction 1D. For example, the second region 2A may be formed at only one end of both ends of the second cutting region CA2 in the first direction 1D or may be formed at both ends of the second cutting region CA2.

Accordingly, when the second cutting region CA2 and the fifth cutting region CA5 are formed in the optical path control member 1000, it may be easily cut by increasing the region to which the laser is irradiated.

As an example, the second region 2A may be formed to extend in the second direction 2D from both ends of the second cutting region CA2 and the fifth cutting region CA5 in the first direction 1D. Accordingly, the second region 2A may be disposed to surround the first region 1A.

FIG. 25 is a cross-sectional view taken along line F-F' of FIGS. 1 and 24. FIG. 25 is a cross-sectional view of a case in which a sealing part is filled in the second cutting region CA2 and the fifth cutting region CA5 and a conductive material is filled in the sixth cutting region CA6.

Referring to FIG. 25, the first sealing part 510 disposed in the first region 1A of the second cutting region CA2 may be disposed in contact with the adhesive layer 410. In addition, the first sealing part 510 disposed in the second region 2A of the second cutting region CA2 may be disposed in contact with the first electrode 210.

That is, the first sealing part 510 may be disposed in contact with different layers according to a position in the second cutting region CA2.

Accordingly, referring to FIG. 25, the first sealing part 510 may be disposed in the region from which the adhesive layer 410 of the optical path control member 1000 is removed. Therefore, it is possible to inhibit or minimize penetration of moisture into the optical path controlling member through the adhesive layer of the optical path controlling member 1000.

Figure 26:
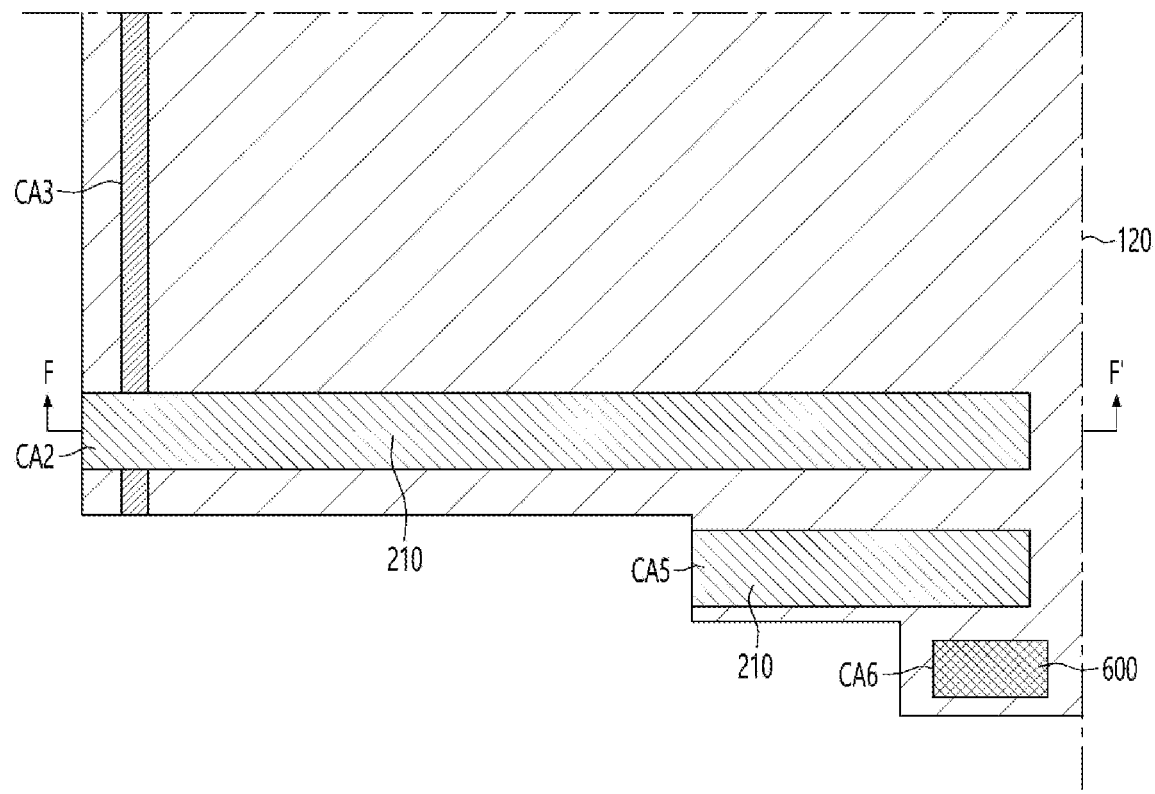
FIG. 26 is still another top view of region G of FIG. 1 for describing second, fifth, and sixth cutting regions of the optical path control member according to the embodiment.
Figure 27:
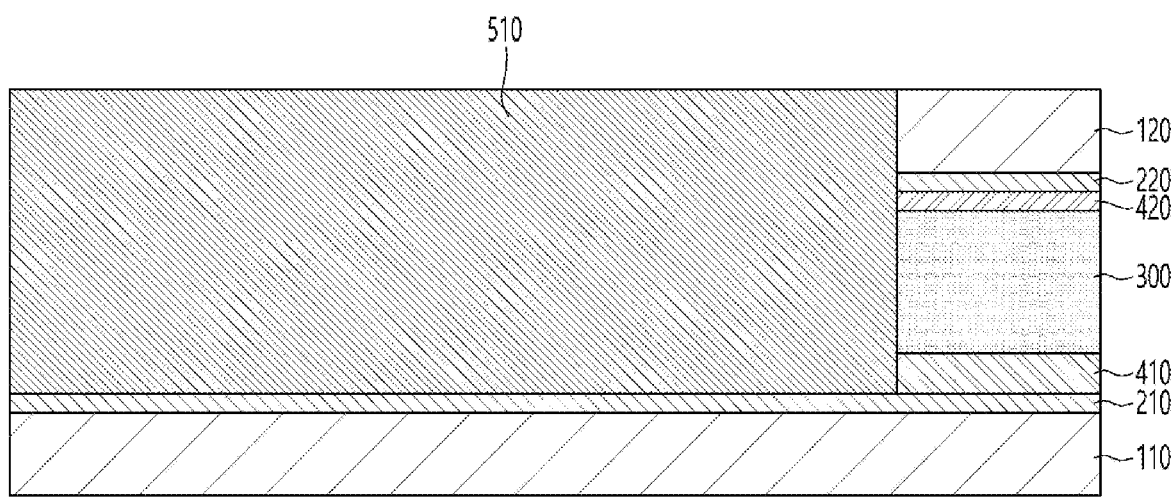
FIG. 27 is a cross-sectional view taken along line F-F' of FIGS. 1 and 26.

FIGS. 26 and 27 are still other views for describing a second cutting region and a fifth cutting region of the optical path control member 1000.

Referring to FIG. 26, the second cutting region CA2 and the fifth cutting region CA5 may be formed by removing at least one of the second substrate 120, the second electrode 220, the buffer layer 420, and the light conversion part 300, and the adhesive layer 410. In detail, the second cutting region CA2 and the fifth cutting region CA5 may be formed by removing the second substrate 120, the second electrode 220, the buffer layer 420, the light conversion part 300, and the adhesive layer 410.

That is, the laser may be irradiated to all regions where the second cutting region CA2 and the fifth cutting region CA5 are to be formed.

Therefore, since the second cutting region CA2 and the fifth cutting region CA5 are formed by removing all of the second substrate 120, the second electrode 220, the buffer layer 420, the light conversion part 300, and the adhesive layer 410, the first electrode 210 may be exposed in in the second cutting region CA2 and the fifth cutting region CA5. That is, the first electrode 210 may be exposed on lower surfaces of the second cutting region CA1 and the fifth cutting region CA5 without a step difference.

FIG. 27 is a cross-sectional view taken along line F-F' of FIGS. 1 and 26. FIG. 27 is a cross-sectional view of a case in which a sealing part is filled in the second cutting region CA2 and the fifth cutting region CA5 and a conductive material is filled in the sixth cutting region CA6.

Referring to FIG. 27, the first sealing part 510 disposed in the second cutting region CA2 may be disposed in contact with the first electrode 210. That is, all of the first sealing parts 510 disposed in the first cutting region CA1 may be disposed in contact with the first electrode 210.

Accordingly, referring to FIG. 27, the outer surface ES of the optical path control member 1000 formed by the second cutting region CA2 of the optical path control member 1000 may be formed by the first sealing part 510.

Therefore, when moisture penetrates into the optical path control member through the outer surface of the optical path control member 1000, it is possible to inhibit or minimize penetration of moisture into the optical path control member through the first sealing part 510.

Hereinafter, a third cutting region, a fourth cutting region, and a second sealing part will be described with reference to FIGS. 28 and 29.

Figure 28:
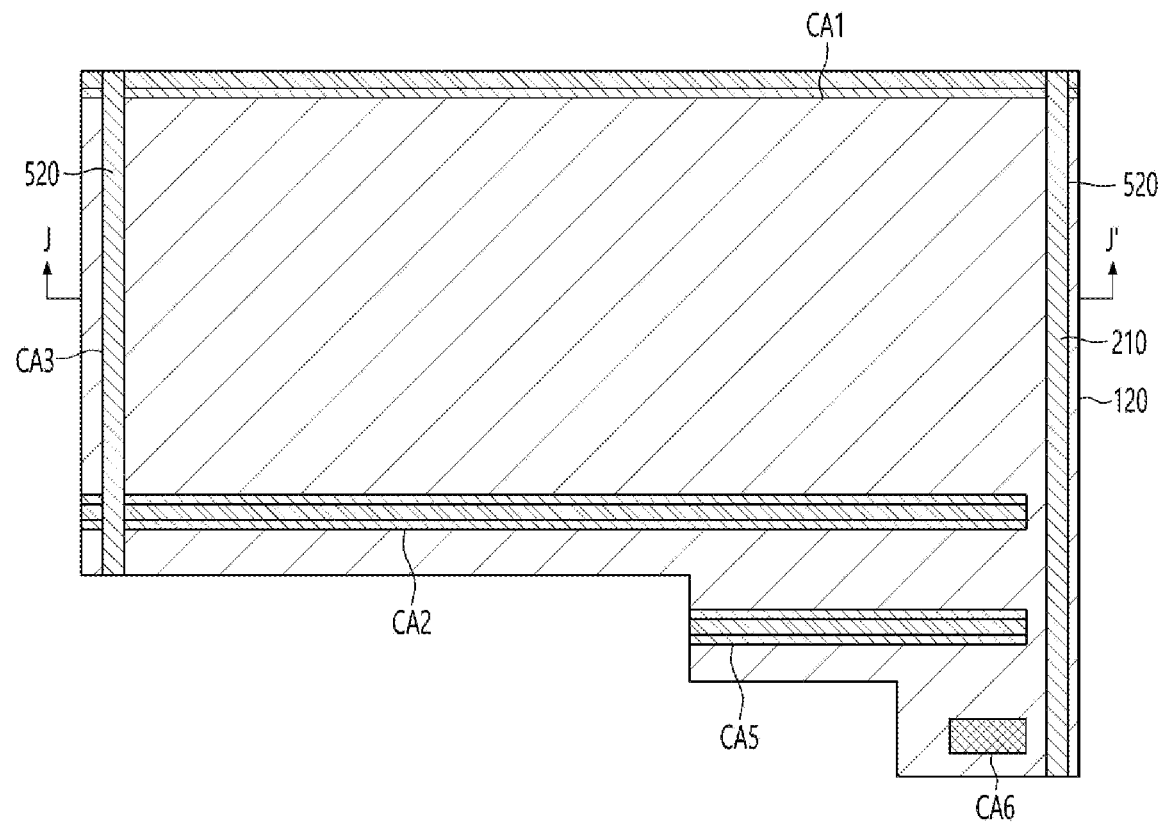
FIG. 28 is a top view for describing a third cutting region and a fourth cutting region of the optical path control member according to the embodiment.

Referring to FIG. 28, the third cutting region CA3 and the fourth cutting region CA4 may extend in a width direction in the second direction 2D.

The third cutting region CA3 and the fourth cutting region CA4 may be formed by partially removing the optical path control member 1000. The third cutting region CA3 and the fourth cutting region CA4 may be formed by removing at least one of the second substrate 120, the second electrode 220, the buffer layer 420, the light conversion part 300, and the adhesive layer 410.

In detail, the second substrate 120, the second electrode 220, the buffer layer 420, the light conversion part 300, and the adhesive layer 410 may be removed in the third cutting region CA3 and the fourth cutting region CA4.

Accordingly, the first electrode 210 may be exposed in the third cutting region CA3 and the fourth cutting region CA4.

Alternatively, a part of the second substrate 120, the second electrode 220, the buffer layer 420, the light conversion part 300, and the adhesive layer 410 may be removed in the third cutting region CA3 and the fourth cutting region CA4.

Accordingly, the adhesive layer 410 from which a part is removed may be exposed in the third cutting region CA3 and the fourth cutting region CA4.

Figure 29:
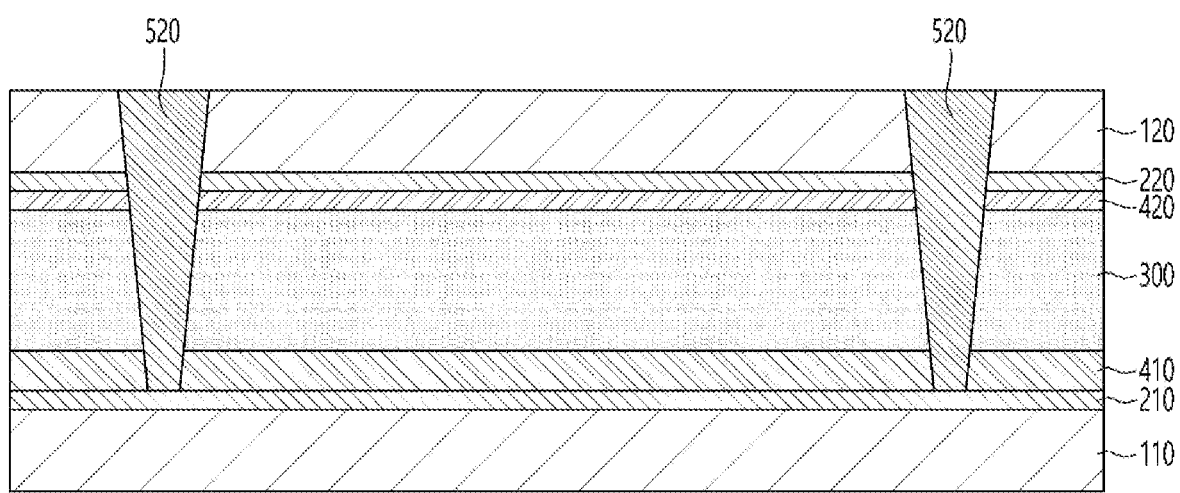
FIG. 29 is a cross-sectional view taken along line J-J' of FIG. 28.
Figure 30:
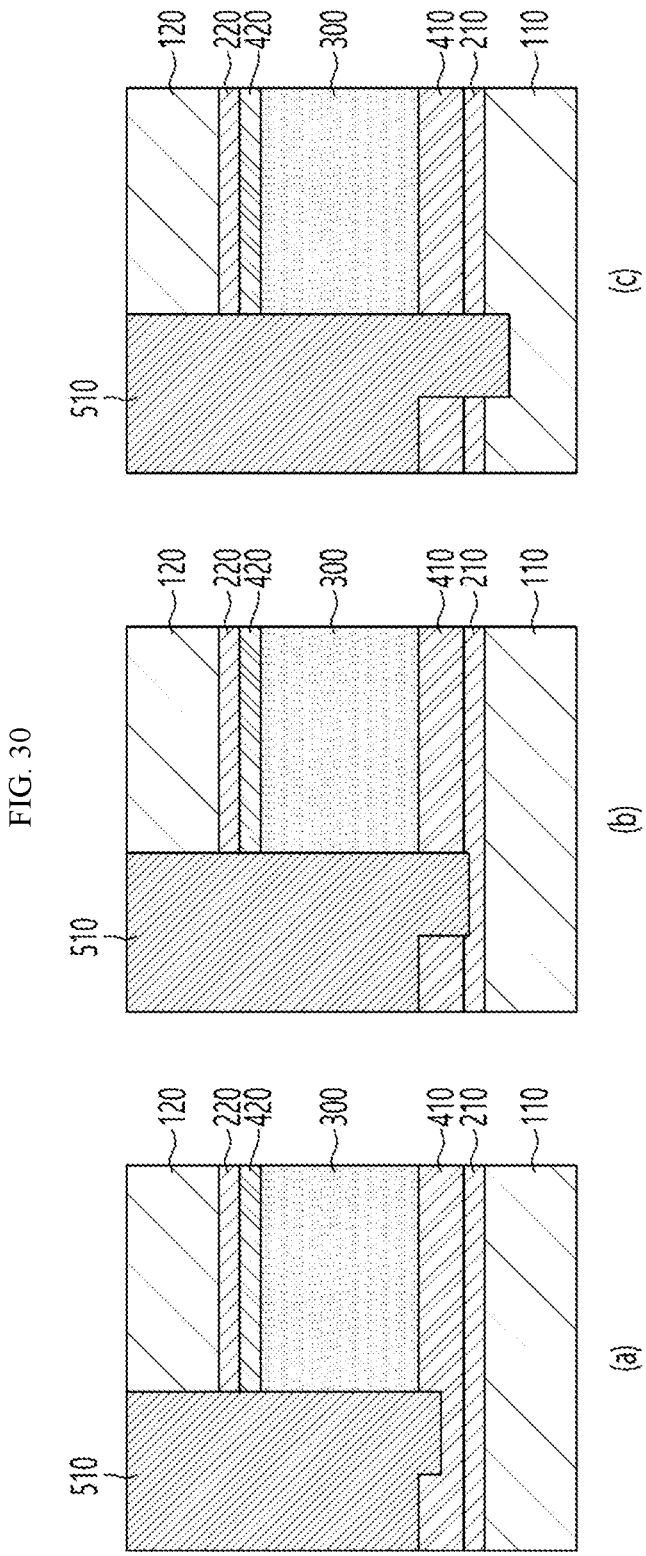
FIG. 30 is a view for describing various shapes of the cutting region of the optical path control member according to the embodiment.

FIG. 29 is a cross-sectional view taken along line J-J' of FIGS. 1 and 28. FIG. 30 is a cross-sectional view of a case in which a sealing part is filled in the third cutting region CA3 and the fourth cutting region CA4.

Referring to FIG. 29, the second sealing part 520 disposed in the third cutting region CA3 and the fourth cutting region CA4 may be disposed in contact with the first electrode 210. Alternatively, when the adhesive layer is partially removed as described above, the second sealing part 520 disposed in the third cutting region CA3 and the fourth cutting region CA4 may be disposed in contact with the adhesive layer 410.

Accordingly, when moisture is penetrated through the adhesive layer 410, the moisture may move from the adhesive layer 410 toward the light conversion part 300 and then may be blocked by the sealing part 520 disposed adjacent to the light conversion part 300.

That is, it is possible to inhibit or minimize the movement of moisture penetrated through the adhesive layer 410 to the light conversion part 300 by the second sealing part 520.

Meanwhile, in the foregoing description, it has been mainly described that the adhesive layer 410 is completely removed from the first to fifth cutting regions, but the embodiment is not limited thereto.

For example, referring to (a) of FIG. 30, the adhesive layer 410 may partially remain in the second region 2A of the first cutting region CA1. In detail, the adhesive layer 410 may partially remain so that the second region 2A of the first cutting region CA1 has a thickness of 50% or less of a thickness of the first region 1A.

Alternatively, referring to (b) of FIG. 30, the adhesive layer 410 may be completely removed in the second region 2A of the first cutting region CA1, and the first electrode 210 may also be partially removed. In detail, the adhesive layer 410 may be partially removed together with the first electrode 210 so that the second region 2A of the first cutting region CA1 has a thickness of 50% to less than 100% of the thickness of the first electrode 210 of the first region 1A.

Alternatively, referring to (c) of FIG. 30, the adhesive layer 410 and the first electrode 210 may be completely removed in the second region 2A of the first cutting region CA1, and the first substrate 110 may also be partially removed.

Like the first cutting region, the adhesive layer may remain or the first electrode may be completely or partially removed in the second to fifth cutting regions.

In addition, in the foregoing description, the adhesive layer is removed from an edge of the cutting region or the adhesive layer is completely removed from the cutting region in the first to fifth cutting regions, but the embodiment is not limited thereto.

Figure 31:
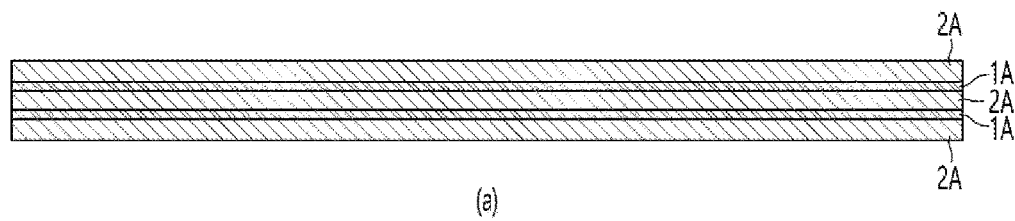
FIG. 31 is a view for describing various pattern shapes of the cutting region of the optical path control member according to the embodiment.
Figure 31:
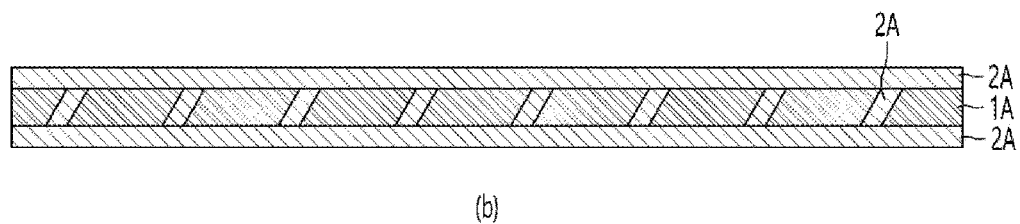

For example, referring to (a) of FIG. 31, three or more second regions 2A of the first cutting region CA1 may be formed. That is, at least three second regions extending in the same direction may be formed.

Alternatively, referring to (b) of FIG. 31, the second region 2A of the first cutting region CA1 may include a plurality of regions extending in different directions. For example, the second region 2A of the first cutting region CA1 may include a plurality of regions extending in a first direction, a second direction, and a direction between the first direction and the second direction.

That is, the second region having various pattern shapes may be formed in the first cutting region by adjusting a direction and intensity of the laser for forming the second region.

Like the first cutting regions, the second regions having various pattern shapes may be formed the second to fifth cutting regions.

Hereinafter, a method of manufacturing an optical path control member according to embodiments will be described with reference to FIGS. 32 to 38. In the description of the method of manufacturing the optical path controlling member according to the embodiments, descriptions the same as or similar to those of the optical path controlling member according to the above-described embodiments will be omitted, and the same reference numerals will be assigned to the same configurations.

Figure 32:
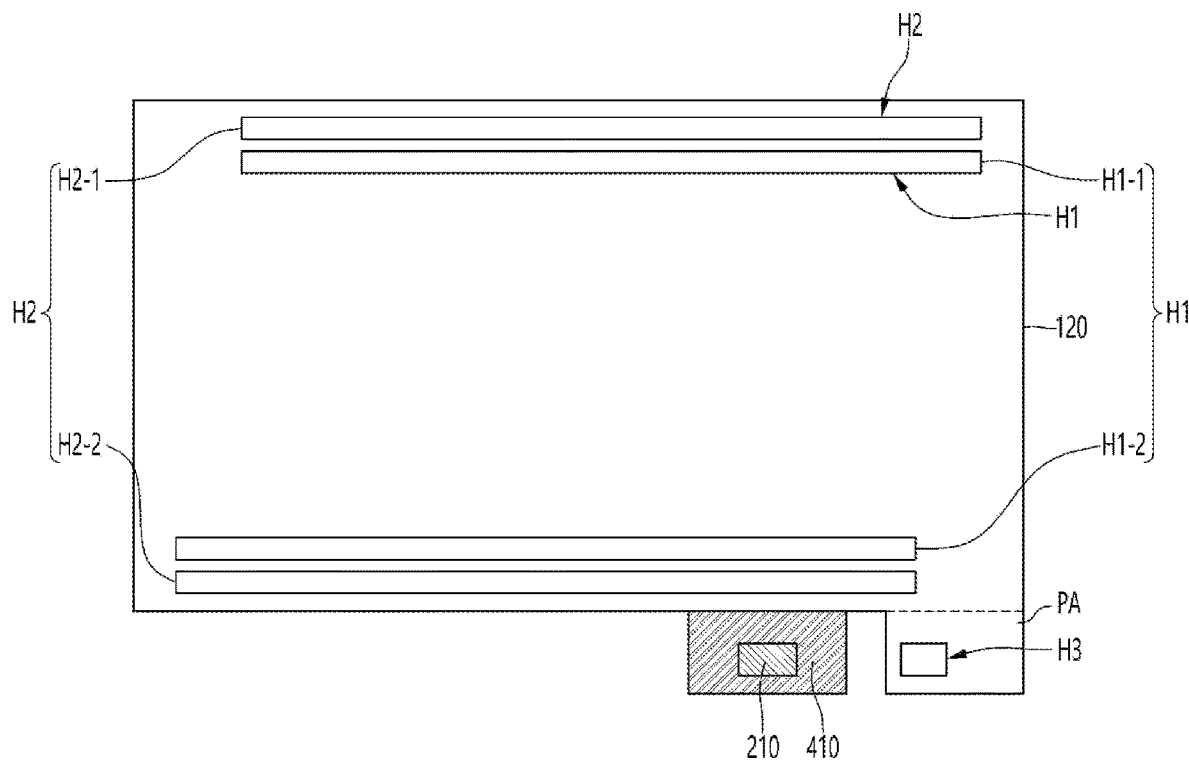
FIGS. 32 to 38 are views for describing a method of manufacturing an optical path control member according to an embodiment.

Referring to FIG. 32, the first substrate 110 and the second substrate 120 may be adhered through an adhesive layer 410. That is, the first substrate 110 and the second substrate 120 may be adhered to each other so that the second substrate 120 is disposed on the first substrate 110.

Subsequently, a plurality of holes may be formed on the second substrate 120. In detail, a first hole H1, a second hole H2, and a third hole H3 may be formed on the second substrate 120.

The first hole H1 may include a 1-1 hole H1-1 and a 1-2 hole H1-2 that are disposed to be spaced apart from each other and face each other. In addition, the second hole H2 may include a 2-1 hole H2-1 and a 2-2 hole H2-2 that are disposed to be spaced apart from each other and face each other.

The 1-1 hole H1-1, the 1-2 hole H1-2, the 2-1 hole H2-1, and the 2-2 hole H2-2 may extend in a length direction of the first direction.

The 1-1 hole H1-1 and the 1-2 hole H1-2 may be disposed far from an edge of the second substrate 120 than the 2-1 hole H2-1 and the 2-2 hole H2-2.

The 1-1 hole H1-1, the 1-2 hole H1-2, the 2-1 hole H2-1, and the 2-2 hole H2-2 may be formed by removing the second substrate 120, the second electrode 220, the buffer layer 420, the light conversion part 300, and the adhesive layer 410. In this case, the adhesive layer 410 may be completely removed or partially removed.

The 1-1 hole H1-1 may correspond to the first cutting region CA1 described above, and the 1-2 hole H1-2 may correspond to the second cutting region CA2 described above. The second hole H1-1 may correspond to the fifth cutting region CA5 described above.

In addition, the third hole H3 may be formed in the protrusion PA of the second substrate 120. The third hole H3 may be formed by removing at least one of the second substrate 120, the second electrode 220, the buffer layer 420, the light conversion part 300, and the adhesive layer 410.

The conductive material 600 described above is disposed in the third hole H3, and accordingly, the third hole H3 may form a second connection electrode CE2 connected to the second electrode 220.

Figure 33:
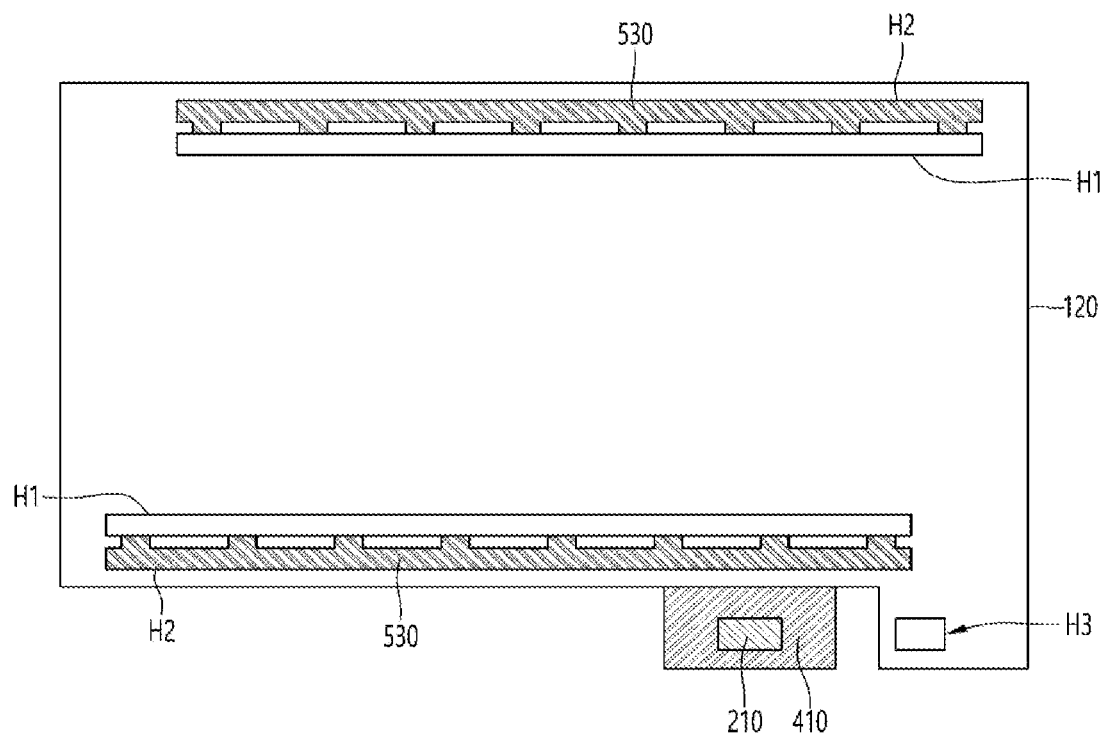

Subsequently, referring to FIG. 33, a sealing material may be filled into the second hole H2. Accordingly, a third sealing part 530 may be disposed inside the second hole H2. The third sealing part 530 may serve as a dam blocking the movement of the light conversion material when the light conversion material 330 is injected into the reception part 320.

The third sealing part 530 may be partially or entirely filled to a region between the first hole H1 and the second hole H2 along the reception part 320.

The third sealing part 530 may include polyurethane acrylate, but the embodiment is not limited thereto.

Figure 34:
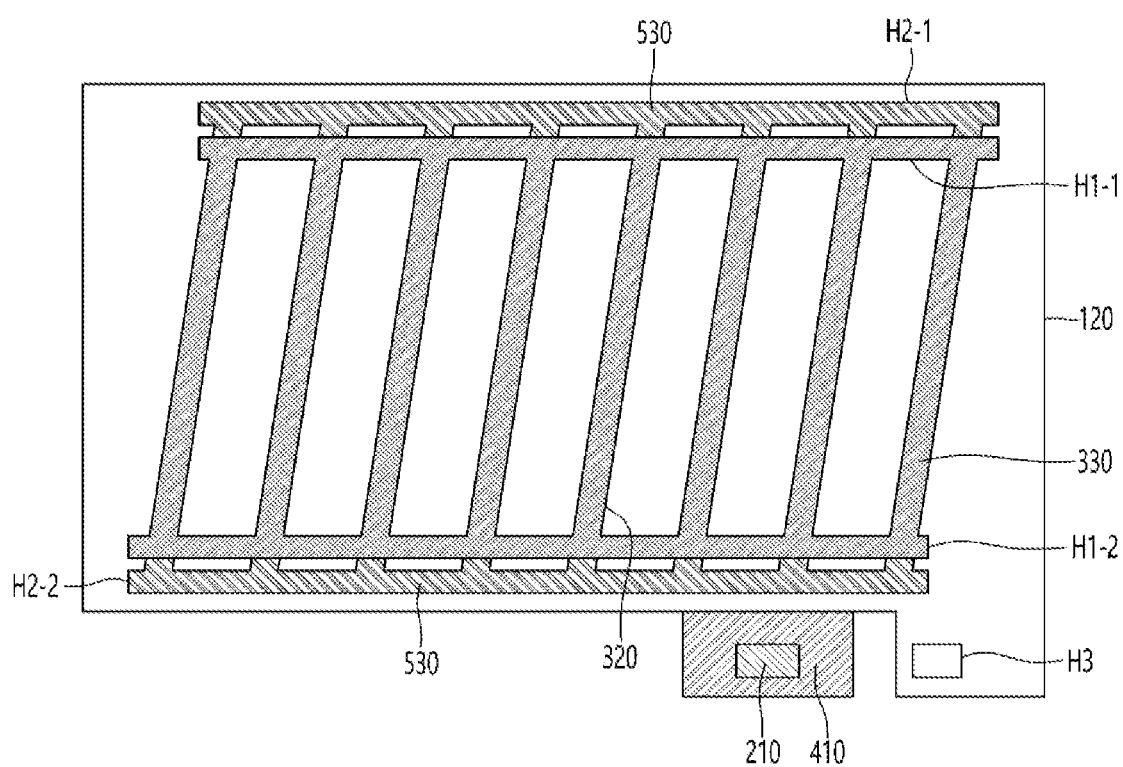

Referring to FIG. 34, the light conversion material 330 including the light conversion particles 330a and the dispersion liquid 330b may be injected into the reception part 320 through the first hole H1. Accordingly, the light conversion material 330 may be filled in the reception part 320, the first hole H1, and the second hole H2.

The reception part 320 may be disposed to be tilted at a constant inclination angle with respect to the second direction 2A, and accordingly, the light conversion material 330 may also be tilted at a constant inclination angle to be filled.

For example, after designating the 1-1 hole H1-1 of one of the first holes H1 facing each other as an injection part and designating the 1-2 hole H1-2 as a suction part, dispensing the light conversion material inside the injection part, and then the light conversion material may be filled into the reception part 320 by a capillary method for sucking the light conversion material from the suction part.

Figure 35:
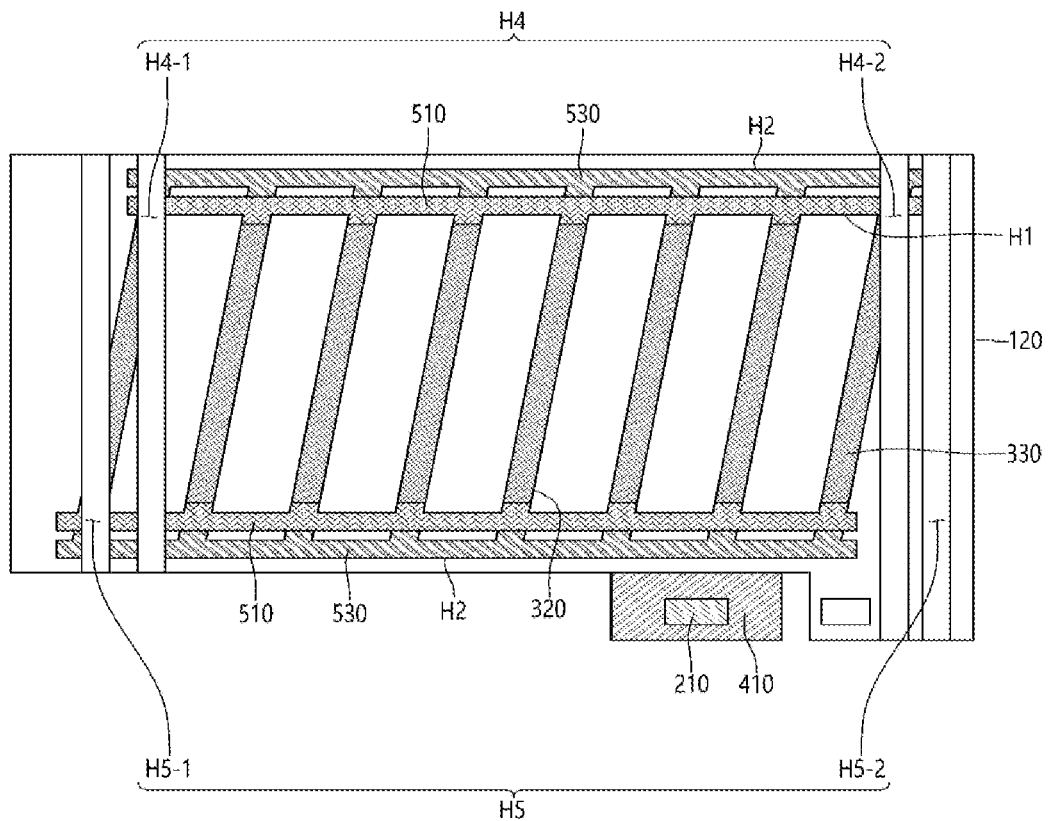

Subsequently, referring to FIG. 35, the first sealing part 510 may be formed by filling the sealing material into the 1-1 hole H1-1 and the 1-2 hole H1-2.

The first sealing part 510 may include the same material as the third sealing part 530, but the embodiment is not limited thereto.

Meanwhile, the inside of the first hole H1 is cleaned before filling the sealing material in order to easily fill the sealing material into the first hole H1, and a process for forming an injection passage of the sealing material (for example, a cleaning process) may be additionally performed.

Meanwhile, the first sealing part 510 may be partially moved into the reception part 320 while being disposed inside the first hole H1. Accordingly, the light conversion material 330 and the sealing material may be disposed together in the reception part 320.

Subsequently, a fourth hole H4 and a fifth hole H5 may be additionally formed. In detail, the fourth hole H4 and the fifth hole H5 extending in the second direction may be formed on the second substrate 120. That is, the fourth hole H4 and the fifth hole H5 may be formed by irradiating the laser from the second substrate 120 toward the first substrate 110.

The fourth hole H4 may include a 4-1 hole H4-1 and a 4-2 hole H4-2 that are disposed to be spaced apart from each other and face each other. In addition, the fifth hole H5 may include a 5-1 hole H5-1 and a 5-2 hole H5-2 that are disposed to be spaced apart from each other and face each other.

The 4-1 hole H4-1, the 4-2 hole H4-2, the 5-1 hole H5-1, and the 5-2 hole H5-2 may extend in a length direction of the second direction.

The 4-1 hole H4-1 and the 4-2 hole H4-2 may be disposed far from the edge of the second substrate 120 than the 5-1 hole H5-1 and the 5-2 hole H5-2. 2.

The 4-1 hole H4-1, the 4-2 hole H4-2, the 5-1 hole H5-1, and the 5-2 hole H5-2 may be formed by removing the second substrate 120, the second electrode 220, the buffer layer 420, the light conversion part 300, and the adhesive layer 410. In this case, the adhesive layer 410 may be completely removed or partially removed.

At least one of the fourth hole H4 and the fifth hole H5 may be disposed to overlap the first hole H1 and the second hole H2.

The 4-1 hole H4-1 may correspond to the third cutting region CA3 described above, and the 4-2 hole H4-2 may correspond to the fourth cutting region CA4 described above.

Meanwhile, the 4-1 hole H4-1, the 4-2 hole H4-2, the 5-1 hole H5-1, and the 5-2 hole H5-2 may be formed simultaneously with the first hole H1 and the second hole H2 described above.

Figure 36:
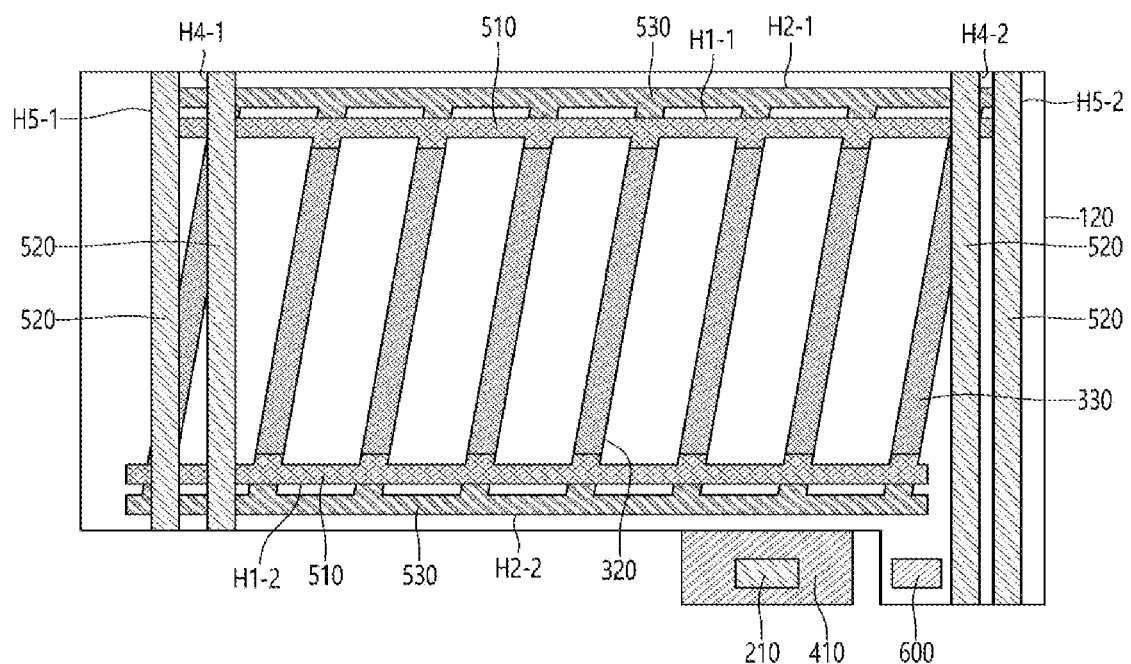

Subsequently, referring to FIG. 36, a second sealing part 520 may be formed by disposing a sealing material inside the fourth hole H4 and the fifth hole H5.

The second sealing part 520 may include the same material as the first sealing part 510 and the third sealing part 530 described above, but the embodiment is not limited thereto.

Figure 37:
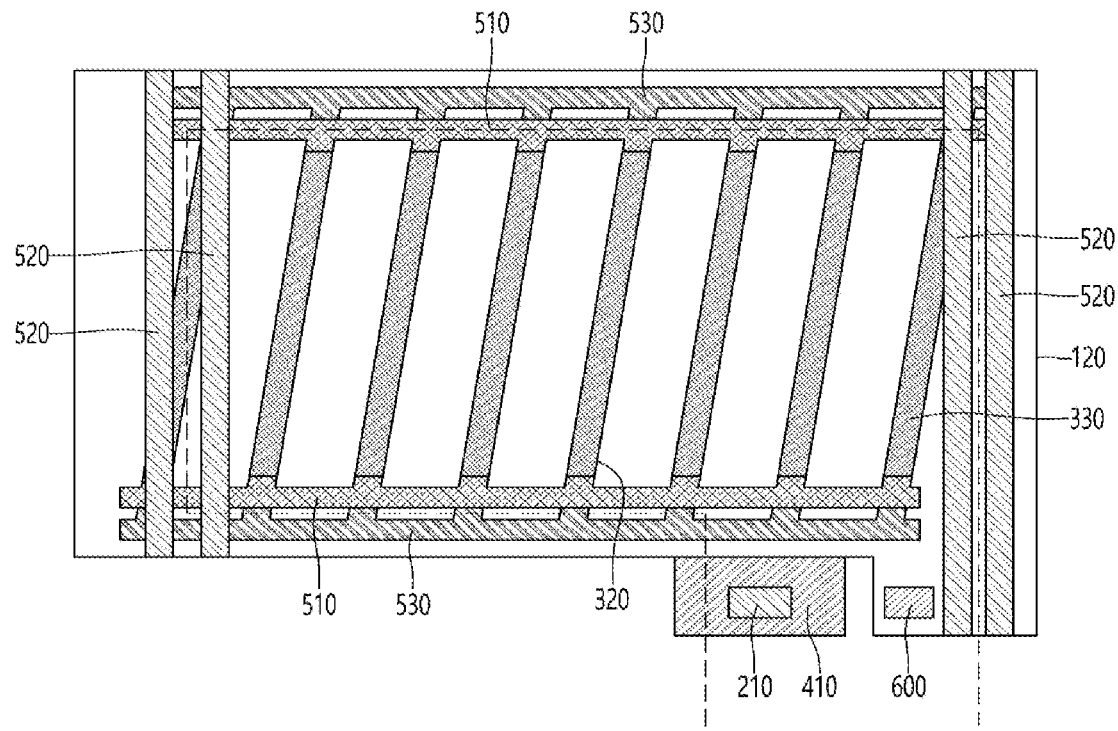
Figure 38:
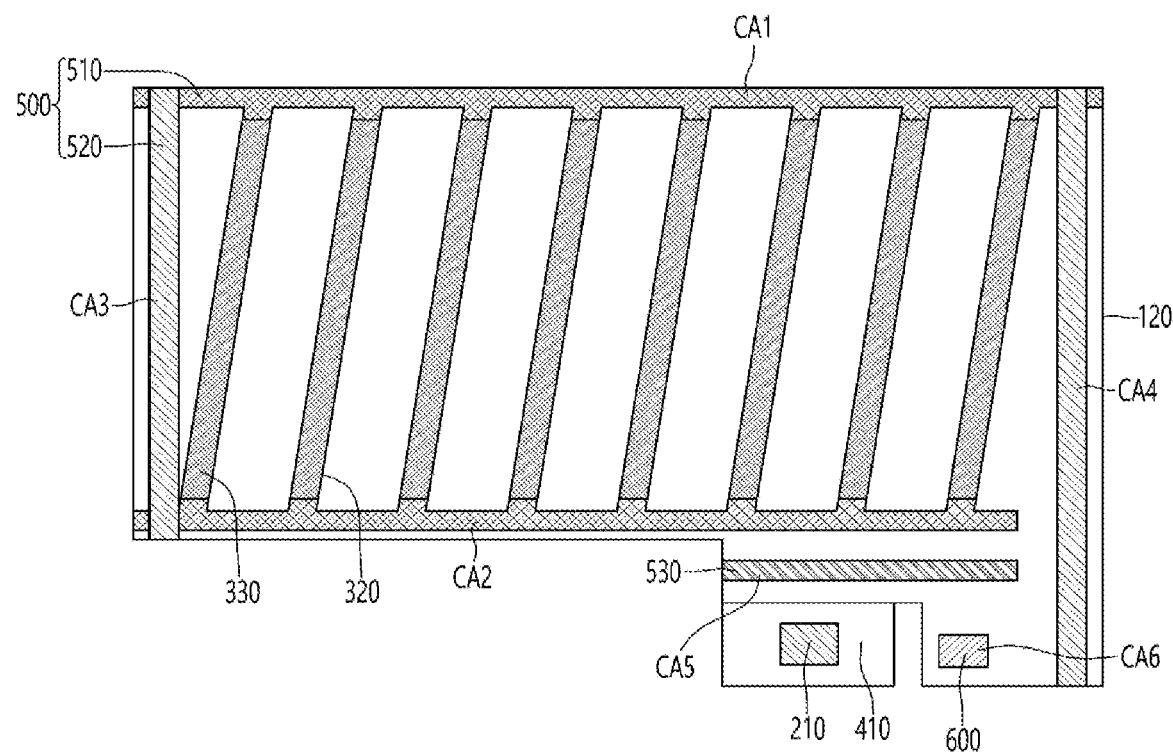

Subsequently, referring to FIG. 37, the optical path control member of FIG. 38 may be finally manufactured by cutting in a dotted line direction of FIG. 36.

Hereinafter, referring to FIGS. 39 to 40, a display device to which an optical path control member according to an embodiment is applied will be described.

Figure 39:
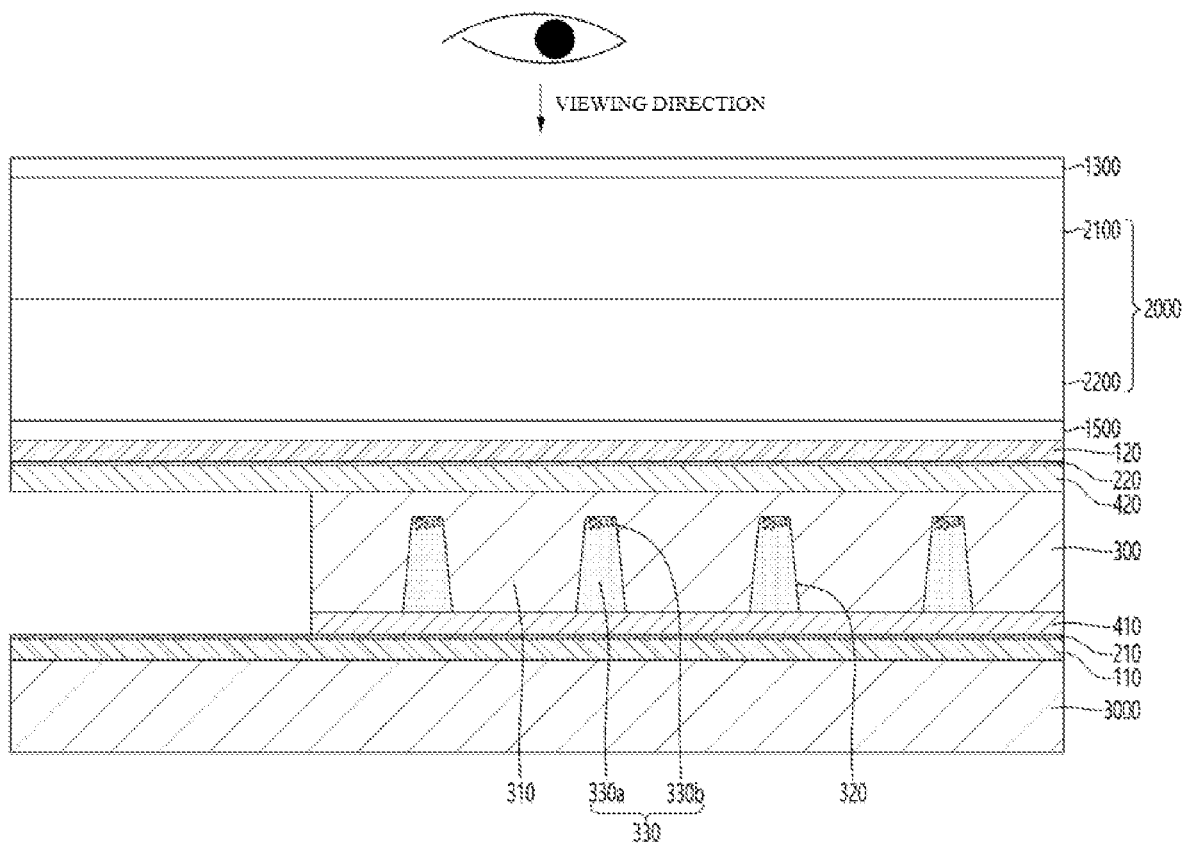
FIGS. 39 and 40 are cross-sectional views of a display device to which an optical path control member according to an embodiment is applied.
Figure 40:
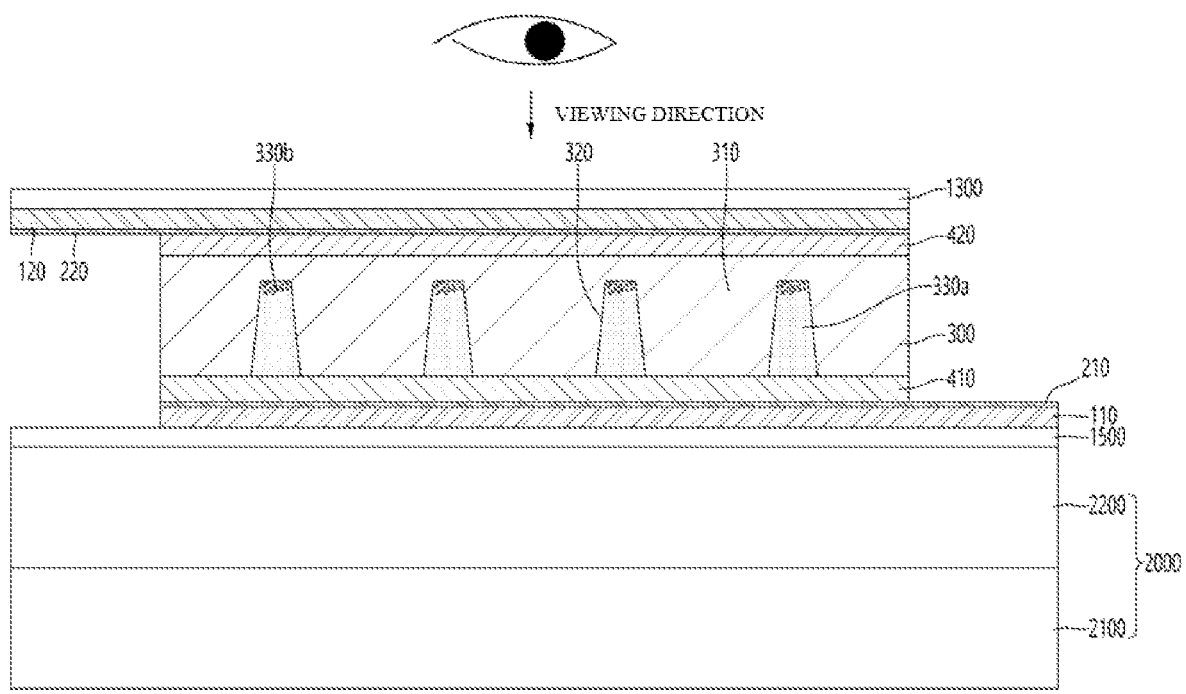

Referring to FIGS. 39 to 40, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first base substrate 2100 and a second base substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first base substrate 2100 including a thin film transistor (TFT) and a pixel electrode and the second base substrate 2200 including color filter layers are adhered to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first base substrate 2100 and the second base substrate 2200 is adhered to the first base substrate 2100 with the liquid crystal layer interposed therebetween. That is, a thin film transistor may be formed on the first base substrate 2100, a protective film may be formed on the thin film transistor, and a color filter layer may be formed on the protective film. In addition, a pixel electrode in contact with the thin film transistor may be formed on the first base substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 39, the optical path control member may be disposed under the liquid crystal panel and on the backlight unit 3000, and the optical path control member may be disposed between the backlight unit 3000 and the display panel 2000.

Alternatively, as shown in FIG. 40, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first base substrate 2100, and an organic light emitting element in contact with the thin film transistor may be formed. The organic light emitting element may include an anode, a cathode, and an organic light emitting layer formed between the anode and the cathode. In addition, the second base substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000.

Further, a touch panel may be further disposed between the display panel and the optical path control member.

It is shown in the drawings that the light conversion part of the optical path control member according to the embodiment is in a direction parallel or perpendicular to an outer surface of the second substrate, but the light conversion part is formed to be inclined at a predetermined angle from the outer surface of the second substrate. Through this, a moire phenomenon occurring between the display panel and the optical path control member may be reduced.

Figure 41:
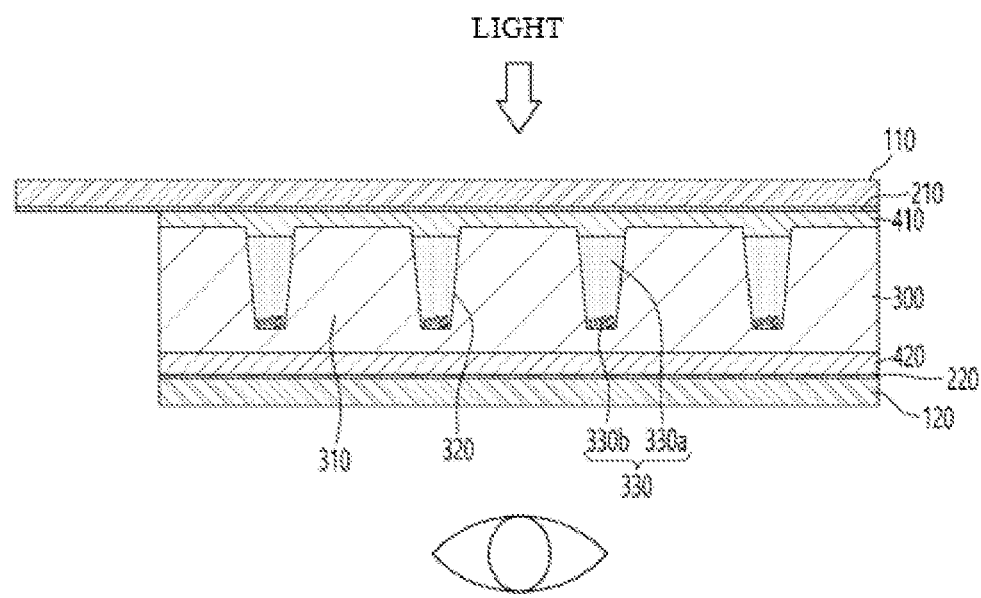
FIGS. 41 to 43 are views for describing one embodiment of the display device to which the optical path control member according to the embodiment is applied.
Figure 41:
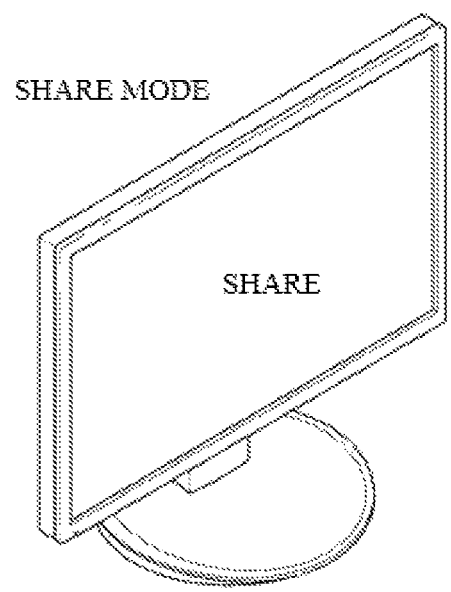
Figure 42:
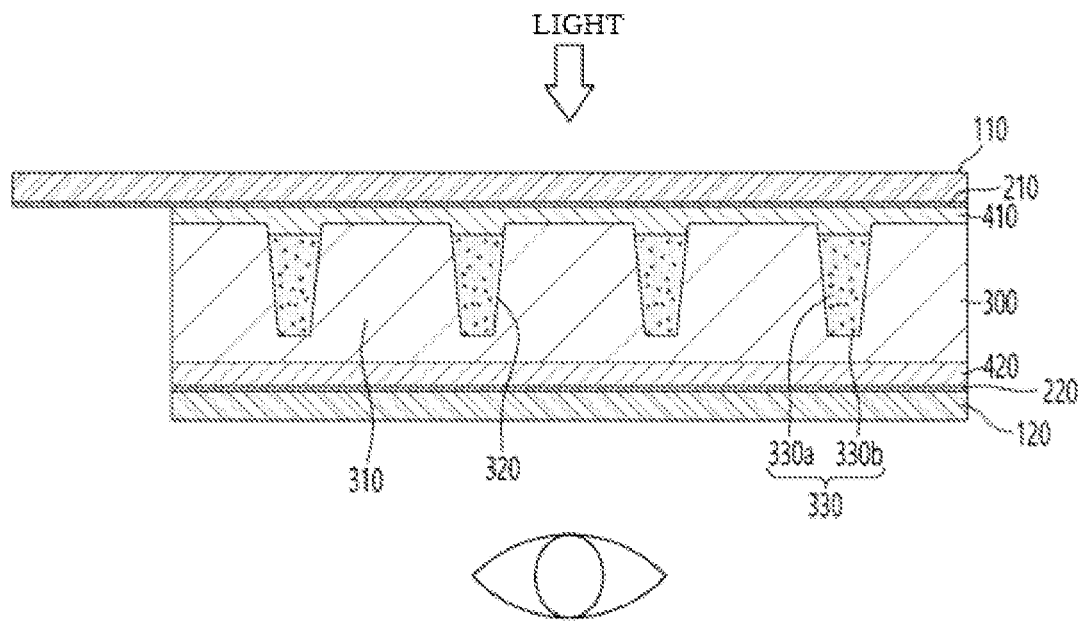
Figure 42:
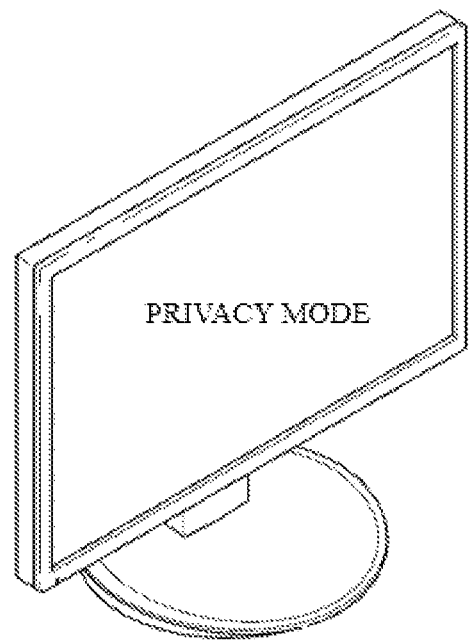
Figure 43:
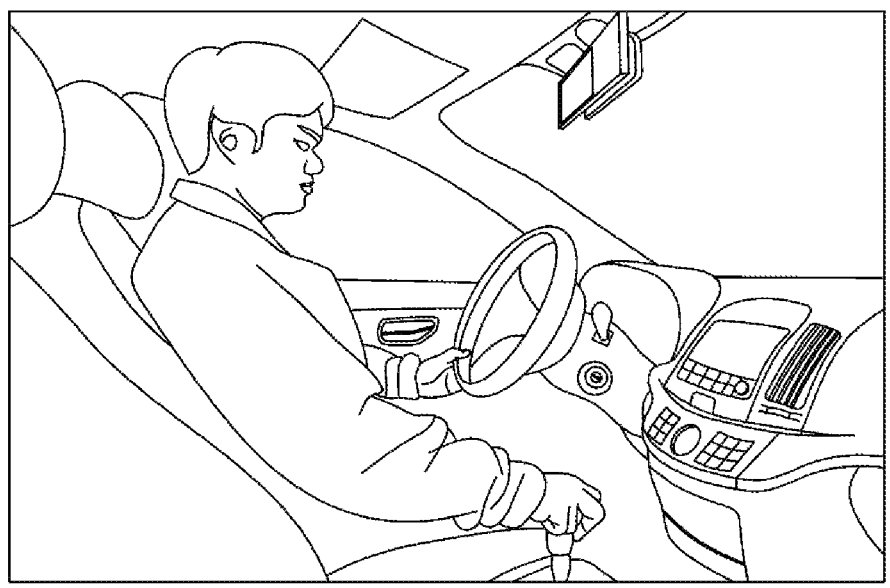

Referring to FIGS. 41 to 43, an optical path control member according to an embodiment may be applied to various display devices.

Referring to FIGS. 41 to 43, the optical path control member according to the embodiment may be applied to a display device that displays a display.

For example, when power is applied to the optical path control member as shown in FIG. 41, the reception part functions as the light transmitting part, so that the display device may be driven in the share mode, and when power is not applied to the optical path control member as shown in FIG. 42, the reception part functions as the light blocking part, so that the display device may be driven in the privacy mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 43, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

What is claimed is:

1. An optical path control member comprising:
   a first substrate on which a first direction and a second direction are defined;
   a first electrode disposed on the first substrate;
   a second substrate disposed on the first substrate and defining the first direction and the second direction;
   a second electrode positioned under the second substrate;
   a light conversion part disposed between the first electrode and the second electrode;
   an adhesive layer disposed between the first electrode and the light conversion part; and
   a cutting region formed by removing the second substrate, the second electrode, and the light conversion part,
   wherein the cutting region includes a first cutting region and a second cutting region that extend in a length direction of the first direction and are disposed to face each other in the second direction, wherein the first cutting region and the second cutting region include a first region in which the adhesive layer is formed and a second region formed by partially or entirely removing the adhesive layer, wherein a first sealing part is disposed in the cutting region, wherein the first sealing part is in contact with the adhesive layer in the first region, and the first sealing part is in contact with the first electrode in the second region, and the adhesive layer is in contact with the first electrode.

2. The optical path control member of claim 1, wherein a height of the adhesive layer in the first region is greater than a height of the adhesive layer in the second region.

3. The optical path control member of claim 1, wherein the second region extends in at least one of the first direction and the second direction.

4. The optical path control member of claim 1, wherein the second region surrounds the first region.

5. The optical path control member of claim 1, comprising a fifth cutting region that is spaced apart in a direction opposite to the first cutting region based on the second cutting region and extends in the length direction of the first direction, wherein the fifth cutting region includes a first region in which the adhesive layer is formed and a second region formed by partially or entirely removing the adhesive layer, and wherein a third sealing part is disposed in the fifth cutting region.

6. The optical path control member of claim 1, wherein the second cutting region is disposed closer to the first cutting region than to a fifth cutting region, and wherein a thickness of the adhesive layer of the second region of the second cutting region is different from a thickness of the adhesive layer of a second region of the fifth cutting region.

7. The optical path control member of claim 6, wherein the thickness of the adhesive layer of the second region of the second cutting region is greater than the thickness of the adhesive layer of the second region of the fifth cutting region.

8. The optical path control member of claim 5, wherein the third sealing part is in contact with the adhesive layer in the first region of the fifth cutting region, and wherein the third sealing part is in contact with the first electrode in the second region of the fifth cutting region.

9. The optical path control member of claim 1, wherein the light conversion part includes a plurality of partition wall parts and a reception part disposed between the plurality of partition wall parts, and wherein the reception part extends in a direction inclined with respect to the second direction.

10. The optical path control member of claim 1, comprising a third cutting region and a fourth cutting region that extend in the second direction and face to each other in the first direction, wherein the third cutting region and the fourth cutting region are disposed to expose at least one of the adhesive layer and the first electrode, and wherein a second sealing part is disposed in the third cutting region and the fourth cutting region.

11. The optical path control member of claim 10, wherein the third cutting region and the fourth cutting region are disposed to expose at least one of the first substrate, the adhesive layer, the first electrode, and the light conversion part.

12. A display device comprising:
a panel including at least one of a display panel and a touch panel; and
the optical path control member of claim 1 disposed on or under the panel.

13. The display device of claim 12, wherein the panel includes a backlight unit and a liquid crystal display panel,
wherein the optical path control member is disposed between the backlight unit and the liquid crystal display panel, and
wherein light emitted from the backlight unit moves from the first substrate to the second substrate.

14. The display device of claim 12, wherein the panel includes an organic light-emitting diode panel,
wherein the optical path control member is disposed on the organic light-emitting diode panel, and
wherein light emitted from the panel moves from the first substrate to the second substrate.

15. An optical path control member comprising:
a first substrate on which a first direction and a second direction are defined;
a first electrode disposed on the first substrate;
a second substrate disposed on the first substrate and defining the first direction and the second direction;
a second electrode positioned under the second substrate;
a light conversion part disposed between the first electrode and the second electrode;
an adhesive layer disposed between the first electrode and the light conversion part; and
a cutting region formed by removing the second substrate, the second electrode, and the light conversion part,
wherein the cutting region includes a first cutting region and a second cutting region that extend in a length direction of the first direction and are disposed to face each other in the second direction,
wherein the first cutting region and the second cutting region include a first region in which the adhesive layer is formed and a second region formed by partially or entirely removing the adhesive layer,
wherein a first sealing part is disposed in the cutting region,
wherein the second cutting region is disposed closer to the first cutting region than to a fifth cutting region, and
wherein a thickness of the adhesive layer of the second region of the second cutting region is different from a thickness of the adhesive layer of a second region of the fifth cutting region.

* * * * *